United States Patent [19]
Bern et al.

[11] Patent Number: 6,030,070
[45] Date of Patent: Feb. 29, 2000

[54] DIRECT ELECTROSTATIC PRINTING METHOD AND APPARATUS

[75] Inventors: Bengt Bern; Mats Moosberg, both of Mölndal, Sweden

[73] Assignee: Array Printers AB, Sweden

[21] Appl. No.: 08/994,793

[22] Filed: Dec. 19, 1997

[51] Int. Cl.[7] .................................................. B41J 2/06
[52] U.S. Cl. ........................................................ 347/55
[58] Field of Search .............................. 347/55, 120, 123, 347/111, 159, 141, 128, 17, 103, 154, 151; 349/327, 71, 352

[56] References Cited

U.S. PATENT DOCUMENTS

| | | |
|---|---|---|
| 3,566,786 | 3/1971 | Kaufer et al. . |
| 3,689,935 | 9/1972 | Pressman et al. . |
| 3,779,166 | 12/1973 | Pressman et al. . |
| 3,815,145 | 6/1974 | Tisch et al. . |
| 4,263,601 | 4/1981 | Nishimura et al. . |
| 4,274,100 | 6/1981 | Pond . |
| 4,353,080 | 10/1982 | Cross . |
| 4,382,263 | 5/1983 | Fischbeck et al. . |
| 4,384,296 | 5/1983 | Torpey . |
| 4,386,358 | 5/1983 | Fischbeck . |
| 4,470,056 | 9/1984 | Galetto et al. . |
| 4,478,510 | 10/1984 | Fujii, et al. . |
| 4,491,794 | 1/1985 | Daley et al. . |
| 4,491,855 | 1/1985 | Fujii et al. . |
| 4,498,090 | 2/1985 | Honda et al. . |
| 4,511,907 | 4/1985 | Fukuchi . |
| 4,525,727 | 6/1985 | Kohashi et al. . |
| 4,571,601 | 2/1986 | Teshima . |
| 4,675,703 | 6/1987 | Fotland . |
| 4,717,926 | 1/1988 | Hotomi . |
| 4,743,926 | 5/1988 | Schmidlin et al. . |
| 4,748,453 | 5/1988 | Lin et al. . |
| 4,814,796 | 3/1989 | Schmidlin . |
| 4,831,394 | 5/1989 | Ochiai et al. . |
| 4,860,036 | 8/1989 | Schmidlin . |
| 4,903,050 | 2/1990 | Schmidlin . |
| 4,912,489 | 3/1990 | Schmidlin . |
| 5,028,812 | 7/1991 | Bartky . |

(List continued on next page.)

FOREIGN PATENT DOCUMENTS

| | | |
|---|---|---|
| 0345 024 A2 | 6/1989 | European Pat. Off. . |
| 0352 997 A2 | 1/1990 | European Pat. Off. . |
| 0377 208 A2 | 7/1990 | European Pat. Off. . |
| 0389 229 | 9/1990 | European Pat. Off. . |
| 0660 201 A2 | 6/1995 | European Pat. Off. . |
| 072 072 A2 | 7/1996 | European Pat. Off. . |
| 0 743 572 A1 | 11/1996 | European Pat. Off. . |
| 0752 317 A1 | 1/1997 | European Pat. Off. . |
| 0764 540 A2 | 3/1997 | European Pat. Off. . |

(List continued on next page.)

OTHER PUBLICATIONS

E. Bassous, et al., "The Fabrication of High Precision Nozzles by the Anisotropic Etching of (100) Silicon", *J. Electrochem. Soc.: Solid–State Science and Technology*, vol. 125, No. 8, Aug. 1978, pp. 1321–1327.

(List continued on next page.)

*Primary Examiner*—John Barlow
*Assistant Examiner*—Raquel Yvette Gordon
*Attorney, Agent, or Firm*—Knobbe, Martens, Olson & Bear, LLP

[57] ABSTRACT

An image recording device and method for recording an image to an information carrier. An intermediate image receiving member and a printhead structure move relative to each other during recording. The image recording device comprises an intermediate image receiving member position measuring means for measuring the position of the intermediate image receiving member in relation to the apertures to thereby via the control unit be able to synchronize the selective opening and closing of apertures through a printhead structure according to the relative movement of the printhead structure and the intermediate image receiving member to thereby enable the formation of a pigment image at a predetermined position on the intermediate image receiving member in view of the image which is to be recorded. The pigment image is subsequently transferred to an information carrier.

24 Claims, 9 Drawing Sheets

U.S. PATENT DOCUMENTS

| | | |
|---|---|---|
| 5,036,341 | 7/1991 | Larsson . |
| 5,038,159 | 8/1991 | Schmidlin et al. . |
| 5,057,855 | 10/1991 | Damouth . |
| 5,072,235 | 12/1991 | Slowik et al. . |
| 5,083,137 | 1/1992 | Badyal et al. . |
| 5,095,322 | 3/1992 | Fletcher . |
| 5,121,144 | 6/1992 | Larson et al. . |
| 5,128,695 | 7/1992 | Maeda . |
| 5,148,595 | 9/1992 | Doggett et al. . |
| 5,170,185 | 12/1992 | Takemura et al. . |
| 5,181,050 | 1/1993 | Bibl et al. . |
| 5,204,696 | 4/1993 | Schmidlin et al. . |
| 5,204,697 | 4/1993 | Schmidlin . |
| 5,214,451 | 5/1993 | Schmidlin et al. . |
| 5,229,794 | 7/1993 | Honman et al. . |
| 5,235,354 | 8/1993 | Larson . |
| 5,237,346 | 8/1993 | Da Costa et al. . |
| 5,256,246 | 10/1993 | Kitamura . |
| 5,257,045 | 10/1993 | Bergen et al. . |
| 5,270,729 | 12/1993 | Stearns . |
| 5,274,401 | 12/1993 | Doggett et al. . |
| 5,307,092 | 4/1994 | Larson . |
| 5,329,307 | 7/1994 | Takemura et al. . |
| 5,374,949 | 12/1994 | Wada et al. . |
| 5,386,225 | 1/1995 | Shibata . |
| 5,402,158 | 3/1995 | Larson . |
| 5,414,500 | 5/1995 | Furukawa . |
| 5,446,478 | 8/1995 | Larson . |
| 5,450,115 | 9/1995 | Bergen et al. . |
| 5,453,768 | 9/1995 | Schmidlin . |
| 5,473,352 | 12/1995 | Ishida . |
| 5,477,246 | 12/1995 | Hirabayashi et al. . |
| 5,477,250 | 12/1995 | Larson . |
| 5,506,666 | 4/1996 | Masuda et al. . |
| 5,508,723 | 4/1996 | Maeda . |
| 5,515,084 | 5/1996 | Larson . |
| 5,526,029 | 6/1996 | Larson et al. . |
| 5,558,969 | 9/1996 | Uyttendaele et al. . |
| 5,559,586 | 9/1996 | Wada . |
| 5,600,355 | 2/1997 | Wada . |
| 5,614,932 | 3/1997 | Kagayama . |
| 5,617,129 | 4/1997 | Chizuk, Jr. et al. . |
| 5,625,392 | 4/1997 | Maeda . |
| 5,640,185 | 6/1997 | Kagayama . |
| 5,650,809 | 7/1997 | Kitamura . |
| 5,666,147 | 9/1997 | Larson . |
| 5,677,717 | 10/1997 | Ohashi . |
| 5,708,464 | 1/1998 | Desie . |
| 5,729,817 | 3/1998 | Raymond et al. ............... 399/384 |
| 5,774,159 | 6/1998 | Larson . |
| 5,805,185 | 9/1998 | Kondo . |
| 5,818,480 | 10/1998 | Bern et al. . |
| 5,818,490 | 10/1998 | Larson . |
| 5,847,733 | 12/1998 | Bern . |
| 5,850,588 | 12/1998 | Yoshikawa ........................ 399/327 |

FOREIGN PATENT DOCUMENTS

| | | |
|---|---|---|
| 12 70 856 | 6/1968 | Germany . |
| 26 53 048 | 5/1978 | Germany . |
| 44-26333 | 11/1969 | Japan . |
| 55-55878 | 4/1980 | Japan . |
| 55-84671 | 6/1980 | Japan . |
| 55-87563 | 7/1980 | Japan . |
| 56-89576 | 7/1981 | Japan . |
| 58-044457 | 3/1983 | Japan . |
| 58-155967 | 9/1983 | Japan . |
| 62-248662 | 10/1987 | Japan . |
| 62-13356 | 11/1987 | Japan . |
| 1-120354 | 5/1989 | Japan . |
| 05220963 | 8/1990 | Japan . |
| 4-189554 | 8/1992 | Japan . |
| 4-268591 | 9/1992 | Japan . |
| 4282265 | 10/1992 | Japan . |
| 5208518 | 8/1993 | Japan . |
| 93331532 | 12/1993 | Japan . |
| 94200563 | 8/1994 | Japan . |
| 9048151 | 2/1997 | Japan . |
| 9-118036 | 5/1997 | Japan . |
| 2108432 | 5/1983 | United Kingdom . |
| 9014960 | 12/1990 | WIPO . |

OTHER PUBLICATIONS

Jerome Johnson, "An Etched Circuit Aperture Array for TonerJet® Printing", *IS&T's Tenth International Congress on Advances in Non–Impact Printing Technologies*, 1994, pp. 311–313.

"The Best of Both Worlds," Brochure of Toner Jet® by Array Printers, *The Best of Both Worlds*, 1990.

DIRECT ELECTROSTATIC PRINTING METHOD AND APPARATUS

FIELD OF THE INVENTION

The present invention relates to direct electrostatic printing methods in which charged toner particles are transported in accordance with an image information form a particle source to an image transfer member to form a toner image which is subsequently transferred onto an information carrier.

BACKGROUND OF THE INVENTION

According to a direct electrostatic printing method, such as that disclosed in U.S. Pat. No. 5,036,341, a background electric field is produced between a developer sleeve and a back electrode to enable the transport of charged toner particles therebetween. A printhead structure, such as an electrode matrix provided with a plurality of selectable apertures, is interposed in the background electric field and connected to a control unit which converts an image information into a pattern of electrostatic control fields which selectively open or close the apertures, thereby permitting or restricting the transport of toner particles from the developer sleeve. The modulated stream of toner particles allowed to pass through opened apertures impinges upon an information carrier, such as paper, conveyed between the printhead structure and the back electrode, to form a visible image.

According to such a method, each single aperture is utilized to address a specific dot position of the image in a transverse direction, i.e. perpendicular to paper motion. Thus, the transversal print addressability is limited by the density of apertures through the printhead structure. For instance, a print addressability of 300 dpi requires a printhead structure having 300 apertures per inch in a transversal direction.

A new concept of direct electrostatic printing, hereinafter referred to as dot deflection control (DDC), was introduced in U.S. patent application Ser. No. 08/621,074. According to the DDC method each single aperture is used to address several dot positions on an information carrier by controlling not only the transport of toner particles through the aperture, but also their transport trajectory toward a paper, and thereby the location of the obtained dot. The DDC method increases the print addressability without requiring a larger number of apertures in the printhead structure. This is achieved by providing the printhead structure with at least two sets of deflection electrodes connected to variable deflection voltages which, during each print cycle, sequentially modify the symmetry of the electrostatic control fields to deflect the modulated stream of toner particles in predetermined deflection directions.

For instance, a DDC method performing three deflection steps per print cycle, provides a print addressability of 600 dpi utilizing a printhead structure having 200 apertures per inch.

An improved DDC method, disclosed in U.S. patent application Ser. No. 08/759,481, provides a simultaneous dot size and dot position control. This later method utilizes the deflection electrodes to influence the convergence of the modulated stream of toner particles thus controlling the dot size. According to the method, each aperture is surrounded by two deflection electrodes connected to a respective deflection voltage D1, D2, such that the electrode field generated by the control electrodes remains substantially symmetrical as long as both deflection voltages D1, D2 have the same amplitude. The amplitudes of D1 and D2 are modulated to apply converging forces on toner to obtain smaller dots. The dot position is simultaneously controlled by modulating the amplitude difference between D1 and D2. Utilizing this improved method enables 60 $\mu$m dots to be obtained utilizing 160 $\mu$m apertures.

It can be considered a drawback of current DDC methods that the properties of the information carrier, e.g. paper properties, can influence the accuracy of the dot size and dot position control. For instance, when printing directly onto paper, the deflection, and thus the dot positions become dependent on paper thickness, conductivity, triboelectric charge concentration, humidity etc. Therefore, there seems to still exist a need to improve the current DDC method.

SUMMARY OF THE INVENTION

An object of the present invention is to provide a method of and device for improving the accuracy of dot deflection control in direct electrostatic printing methods.

A further object of the present invention is to provide a method of direct electrostatic printing which is substantially unaffected by the physical properties of the information carrier onto which an image is to be recorded.

Still a further object of the present invention is to provide a method of and a device for reducing scattering in direct electrostatic printing methods.

Yet a further object of the present invention is to provide a method of and a device for preventing clogging of passages through which toner particles pass in direct electrostatic printing methods.

Another object of the present invention is to provide a method of and device for reducing or eliminating the influence of the electrostatic field used for toner particle transport on anything other than the intended toner particles in direct electrostatic printing methods.

Still another object of the present invention is to provide a method of and a device for trajecting toner particles to predetermined positions, in view of an image which is to be recorded, substantially unaffected by a wide range of environmental conditions and unaffected by the physical properties of the information carrier onto which an image is to be recorded.

Yet another object of the present invention is to provide a method of and a device for trajecting toner particles to predetermined positions, in view of an image which is to be recorded, substantially unaffected of uneven feed due to speed variations caused for example by mechanical imperfections.

Said objects are achieved according to the invention by providing an intermediate image receiving medium whose properties do not alter the accuracy of the dot deflection control, in order to thereby first form a toner image on the intermediate image receiving medium and thereafter transfer that image to an image carrier.

Said objects are also achieved according to the invention by an image recording device and method for recording an image onto an information carrier. The image recording device comprises a pigment particle source, a voltage source, a printhead structure, and an intermediate image receiving member. The pigment particle source provides pigment particles. The intermediate image receiving member and the printhead structure move relative to each other during recording. The intermediate image receiving member has a first face and a second face. The printhead structure is placed inbetween the pigment particle source and the first face of the intermediate image receiving member. The voltage source is connected to the pigment particle source and the back electrode thereby creating an electrical field for transport of pigment particles from the pigment particle source toward the first face of the intermediate image receiving member. The printhead structure includes control electrodes to thereby be able to selectively open or close passages/apertures through the printhead structure to permit or restrict the transport of pigment particles to thereby enable the formation of a pigment image on the first face of the intermediate image receiving member, which pigment image is subsequently transferred to an information carrier. Where according to the method and device of the invention the first face of the intermediate image receiving member is substantially evenly coated with a layer of bouncing reduction agent thus providing a surface on the first face of the intermediate image receiving member that the pigment particles transported through the print head structure substantially adhere to substantially without bouncing.

Suitably the bouncing reduction agent is a liquid having adhesion properties suitable for the adhesion of pigment particles to the first face of the intermediate image receiving member and also suitably the image recording device further comprises a thin application means for applying the bouncing reduction agent liquid substantially evenly as a film layer onto the first face of the intermediate image receiving member. Suitably the bouncing reduction agent is a silicone oil having appropriate adhesion properties for reducing bouncing of pigment particles when pigment particles are transferred onto the first face of the intermediate image receiving means and also having appropriate release properties when a pigment image is transferred to an information carrier from the intermediate image receiving member.

The intermediate image receiving member can suitably include a transfer belt positioned at a predetermined distance from and being movable in relation to the printhead structure, the transfer belt suitably being substantially of uniform thickness. The transfer belt is suitable supported by at least one holding element arranged on the side of the second face of the transfer belt adjacent to the print station.

In certain embodiments according to the invention the image recording device suitably further comprises a transfuser having heating means and pressurising means for transferring a pigment image on the surface of the first face of the intermediate image receiving member to an information carrier by locally applying heat and pressure to the information carrier and the pigment image by the heating means and pressurising means and thereby transferring the pigment image to the information carrier. The pigment particles can suitably be of a polyester type. The printhead structure can advantageously include deflection electrodes to thereby enable the deflection of pigment particles against predetermined locations on the first face of the image receiving member in view of the image which is to be recorded. An image recording device whose printhead structure includes deflection electrodes for controlling the deflection of pigment particles in transport, can advantageously further comprise deflection control feedback means for providing a deflection feedback signal to thereby control the deflection electrodes in such a way that pigment particles are, for formation of a pigment image on the intermediate image receiving member in view of the image which is to be recorded, trajected toward predetermined locations on the intermediate image receiving member.

The image recording device advantageously includes at least two pigment particles sources with corresponding control electrodes and passages/apertures on and in at least one printhead structure. The image reconsign device preferably includes four pigment particle sources with corresponding control electrodes and passages/apertures on and in at least one printhead structure. Image recording devices comprising at least two pigment particle source preferably comprises a corresponding printhead structure with control electrodes and passages/apertures for each pigment particle source.

Preferably the image recording device comprises an intermediate image receiving member bending means to enable the intermediate image receiving member to be bent a predetermined angle in the vicinity of the printhead structure in such a way that, in combination with a tension of the intermediate image receiving member, a stabilization force component is created which is equal to or greater in magnitude than a field force component created by the electrical field and acting on the intermediate image receiving member, to thereby oppose distance fluctuations between the intermediate image receiving member and the printhead structure which is caused by the field force component on the intermediate image receiving member.

Certain embodiments of the image receiving device suitably comprises an intermediate image receiving member position measuring means for measuring the position of the intermediate image receiving member in relation to the passages/apertures to thereby be able to synchronize the selective opening and closing of the passages/apertures through the printhead structure according to the relative movement of the printhead structure and the intermediate image receiving member to thereby enable the formation of the pigment image at a predetermined position on the intermediate image receiving member in view of the image which is to be recorded.

Still in further embodiments according to the invention the image recording device suitably comprises a pressure changing means which can create a pressure difference on the side of the second face of the intermediate image receiving member in the vicinity of the passages/apertures of the printhead structure, and where the intermediate image receiving member comprises a cleaning area for cleaning purposes and a separate image area intended for reception of pigment particles for formation of a pigment image thereon, where the cleaning area includes at least one slot between the first face and the second face intended for transmitting the pressure difference through the intermediate image receiving member to thereby, in cooperation with the pressure changing means in the vicinity of the passages/apertures of the printhead structure, dislodge pigment agglomeration for cleaning the passages/apertures of the printhead structure.

Said objects are also achieved according to the invention by a method for recording an image to an information carrier. The method comprises a number of steps. In a first step pigment particles are provided from a pigment particle source. In a second step an intermediate image receiving member and a printhead structure are moved relative to each other during recording. In a third step a first face of the intermediate image receiving member is coated substantially evenly with a layer of bouncing reduction agent thus providing a surface on the first face of the intermediate image receiving member that transported pigment particles will substantially adhere to substantially without bouncing. In a fourth step an electrical field is created for transporting pigment particles from the pigment particle source toward the first face of the intermediate image receiving member. In a fifth step apertures through a printhead structure are selectively opened or closed to permit or restrict the transporting of pigment particles to thereby enable the formation of a pigment image on the first face of the intermediate image receiving member. And in a final sixth step the pigment image is subsequently transferred to an information carrier.

Further variations of the method according to previously described enhancements are possible in view of the application of the invention.

Said objects are also achieved according to the invention by an image recording device and method for recording an image onto an information carrier. The image recording device comprises an intermediate image receiving member, a pigment particle source, a printhead structure, a back electrode, and a voltage source. The pigment particle source provides pigment particles. The intermediate image receiving member is flexible under a tension and has a first face and a second face. The printhead structure is placed inbetween the pigment particle source and the first face of the intermediate image receiving member. The voltage source is connected to the pigment particle source and the back electrode thereby define an electrical field plane and create an electrical field for transport of pigment particles from the pigment particle source toward the first face of the intermediate image receiving member. The printhead structure includes control electrodes to thereby be able to selectively open or close passages/apertures through the printhead structure to permit or restrict the transport of pigment particles to thereby enable the formation of a pigment image on the first face of the intermediate image receiving member, which pigment image is subsequently transferred to an information carrier. According to the method and device of the invention the image recording device comprises an intermediate image receiving member bending means to enable the intermediate image receiving member to be bent a predetermined angle in the vicinity of the printhead structure in such a way that, in combination with the tension of the intermediate image receiving member, a stabilization force component is created which is equal to or greater in magnitude than a field force component created by the electrical field and acting on the intermediate image receiving member, to thereby oppose distance fluctuations between the intermediate image receiving member and the printhead structure which is caused by the field force component on the intermediate image receiving member.

The stabilization force component is preferably directed in a direction opposite and having a greater magnitude than the field force component. Suitably the intermediate image receiving member bending means comprises the back electrode. The intermediate image receiving member bending means suitably comprises one holding element supporting the intermediate image receiving member, where the holding element is arranged on the side of the second face of the intermediate image receiving member adjacent to the passages/apertures in such a way that the intermediate image receiving member is bent over the holding element creating an angle of more than 180° on the first face of the intermediate image receiving member. The intermediate image receiving member is suitably frictionally supported by the holding element. As an alternative when the holding element is rotationable when the intermediate image receiving member is suitably rotationally supported by the holding element. The holding element suitably comprises the back electrode.

In some embodiments according to the invention the intermediate image receiving member bending means bends the intermediate image receiving member in such a way that a first angle greater than 180° is created on the first face of the intermediate image receiving member perpendicular to the electrical field plane, and where a second angle and a third angle make up the part greater than 180°. The second angle is defined in reference to a reference plane on the first side of the electrical field plane and the third angle is defined in reference to the reference plane on the second side of the electrical field plane. The reference plane is a plane which is perpendicular to the electrical field plane and parallel to the intermediate image receiving member where the first face of the intermediate image receiving member is the closest to the passages/apertures. Preferably the second angle and the third angle are not equal in magnitude or they are substantially equal in magnitude, all depending on the specific embodiment of the invention.

If the particular embodiment is such that the image recording device includes at least two pigment particle sources, then each particle source has their respective corresponding, electrical field, electrical field plane, control electrodes and passages/apertures, stabilization force component, field force component, first angle, second angle, third angle, and reference plane. Which means that the intermediate image receiving member bending means bends the intermediate image receiving member for each one of the pigment particle sources in the vicinity of the respective passages/apertures. In some embodiments the image recording device is capable of recording color images and includes four pigment particle sources. In some embodiments the respective stabilization force components are not parallell. In some embodiments the respective second angles and third angles are substantially equal in magnitude. In some embodiments the respective second angles and third angles are each in the range of 0.5° and 10°. In some embodiments the magnitude of each respective stabilization force component is substantially equal. In some embodiments the magnitudes of the respective stabilization force components are not all substantially equal. In some embodiments the magnitudes of the respective stabilization force components are substantially unequal.

Further embodiments according to previously described enhancements are possible in view of the application of the invention.

Said objects are also achieved according to the invention by a method for recording an image to an information carrier. The method comprises a number of steps. In a first step pigment particles are provided form a pigment particle source. In a second step a tension is added to a flexible intermediate image receiving member having a first face and a second face. In a third step an electrical field is created for transport of pigment particles from the pigment particle source toward the first face of the intermediate image receiving member. In a fourth step the intermediate image receiving member is bent a predetermined angle in the vicinity of a printhead structure in such a way that, in combination with the tension of the intermediate image receiving member, a stabilization force component is created which is equal to or greater in magnitude than a field force component created by the electrical field and acting on the intermediate image receiving member, to thereby oppose distance fluctuations between the intermediate image receiving member and the printhead structure which is caused by the field force component on the intermediate image receiving member. In a fifth step apertures through the printhead structure are selectively opened or closed to permit or restrict the transporting of pigment particles to thereby enable the formation of a pigment image on the first face of the intermediate image receiving member. And finally in a sixth step the pigment image is subsequently transferred to an information carrier.

Further variations of the method according to previously described enhancements are possible in view of the application of the invention.

Said objects are also achieved according to the invention by an image recording device and method for recording an image to an information carrier. The image recording device comprises a pigment particle source, a voltage source, a printhead structure, a control unit, and an intermediate image receiving member. The pigment particle source provides pigment particles. The intermediate image receiving member and the printhead structure move relative to each other during recording. The intermediate image receiving member has a first face and a second face. The printhead structure is placed inbetween the pigment particle source and the first face of the intermediate image receiving member. The voltage source is connected to the pigment particle source and the back electrode to thereby create an electrical field for transport of pigment particles from the pigment particle source toward the first face of the intermediate image receiving member. The printhead structure includes control electrodes connected to the control unit to thereby selectively open or close passages/apertures through the printhead structure to permit or restrict the transport of pigment particles to thereby enable the formation of a pigment image on the first face of the intermediate image receiving member. The pigment image is subsequently transferred to an information carrier. According to the method and device of the invention the printhead structure includes deflection electrodes connected to the control unit for controlling the deflection of pigment particles in transport. The image recording device further comprises deflection control feedback means for providing a deflection feedback signal to the control unit to thereby control the deflection electrodes in such a way that pigment particles are, for formation of a pigment image on the intermediate image receiving member in view of the image which is to be recorded, trajected toward predetermined locations on the intermediate image receiving member.

In some embodiments of the invention the deflection control feedback means suitable comprises measuring means for measuring the density of a pattern formed on the intermediate image receiving member to thereby in dependence of the measured density create the deflection feedback signal. In other embodiments of the invention the deflection control feedback means suitably comprises measuring means for measuring the thickness of a pigment particle pattern formed on the intermediate image receiving member to thereby in dependence of the measured thickness create the deflection feedback signal. In further embodiments of the invention the deflection feedback signal is suitably created in dependence of variations of the measured thickness of a pigment particle pattern formed on the intermediate image receiving member. In still other embodiments of the invention the deflection control feedback means suitably comprises optical measuring means for optically measuring the optical density of a pattern formed on the intermediate image receiving member to thereby in dependence of the measured optical density create the deflection feedback signal. In still further embodiments of the invention the deflection control feedback means suitably comprises capacitive measuring means for measuring the capacitance of a pattern formed on the intermediate image receiving member to thereby in dependence of the measured capacitance create the deflection feedback signal. In even further embodiments of the invention the deflection control feedback means suitably comprises electrical charge measuring means for measuring the electrical charge of a pattern formed on the intermediate image receiving member to thereby in dependence of the measured electrical charge create the deflection feedback signal. In even other embodiments of the invention the deflection control feedback means suitably comprises magnetic flux measuring means for measuring the density of a pattern formed on the intermediate image receiving member to thereby in dependence of the measured density create the deflection feedback signal.

According to one embodiment of the invention the deflection control feedback means suitably comprises measuring means for measuring the density of a predetermined test pattern formed on the intermediate image receiving member to thereby in dependence of the measured density create the deflection feedback signal. The predetermined test pattern can suitably be a line of predetermined width and length. The intermediate image receiving member can suitably comprise a test area intended for reception of pigment particles for formation of the predetermined test pattern and a separate image area intended for reception of pigment particles for formation of a pigment image thereon.

According to the invention at least one passage/aperture suitably comprises two deflection electrodes. The two deflection electrodes of a passage/aperture can suitably have a line of symmetry through both electrodes, which line of symmetry is not parallell or perpendicular to the direction of relative movement between the intermediate image receiving member and the printhead structure. The magnitude of the deflection of pigment particles in transport via a passage/aperture in question is suitably determined by controlling a voltage potential difference between the two deflection electrodes of the passage/aperture in question. A dot size of a dot formed on the intermediate image receiving member by transported pigment particles through a passage/aperture in question is suitably determined according to the invention by controlling an absolute voltage potential applied to both deflection electrodes of the passage/aperture in question. According to the invention the printhead structure preferably has a first side towards the pigment particle source and a second side towards the intermediate image receiving member, and the control electrodes are preferably arranged on the first side of the printhead structure and the deflection electrodes are preferably arranged on the second side of the printhead structure. The intermediate image receiving member suitably includes a transfer belt positioned at a predetermined distance from the printhead structure, the transfer belt being substantially of uniform thickness. The image recording device suitably includes at least two, preferably four, pigment particle sources with corresponding control electrodes and passages/apertures on and in at least one printhead structure.

Further embodiments according to previously described enhancements are possible in view of the application of the invention.

Said objects are also achieved according to the invention by a method for recording an image to an information carrier. The method comprises the a number of steps. In a first step pigment particles are provided from a pigment particle source. In a second step an intermediate image receiving member and a printhead structure are moved relative to each other during recording. In a third step an electrical field is created for transporting of pigment particles from the pigment particle source toward a first face of the intermediate image receiving member. In a fourth step the deflection of pigment particles in transport is controlled. In a fifth step a deflection feedback signal is provided to thereby adjust the controlling of the deflection of pigment particles in transport in such a way that pigment particles are, for formation of a pigment image on the intermediate image receiving member in view of the image which is to be recorded, trajected toward predetermined locations on the intermediate image receiving member. In a sixth step apertures through the printhead structure are selectively opened or closed to permit or restrict the transporting of pigment particles to thereby enable the formation of a pigment image on the first face of the intermediate image receiving member. And finally in a seventh step the pigment image is subsequently transferred to an information carrier.

Further variations of the method according to previously described enhancements are possible in view of the application of the invention.

Said objects are also achieved according to the invention by an image recording device and method for recording an image to an information carrier. The image recording device comprises a pigment particle source, a voltage source, a printhead structure, a control unit, and an intermediate image receiving member. The pigment particle source provides pigment particles. The intermediate image receiving member and the printhead structure move relative to each other during recording. The intermediate image receiving member havs a first face and a second face. The printhead structure is placed inbetween the pigment particle source and the first face of the intermediate image receiving member. The voltage source being connected to the pigment particle source and the back electrode to thereby create an electrical field for transport of pigment particles from the pigment particle source toward the first face of the intermediate image receiving member. The printhead structure includes control electrodes connected to the control unit to thereby selectively open or close passages/apertures through the printhead structure to permit or restrict the transport of pigment particles to thereby enable the formation of a pigment image on the first face of the intermediate image receiving member. The pigment image is subsequently transferred to an information carrier. According to the method and device of the invention the image recording device comprises an intermediate image receiving member position measuring means for measuring the position of the intermediate image receiving member in relation to the passage/apertures to thereby via the control unit be able to synchronize the selective opening and closing of the passages/apertures through the printhead structure according to the relative movement of the printhead structure and the intermediate image receiving member to thereby enable the formation of a pigment image at a predetermined position on the intermediate image receiving member in view of the image which is to be recorded.

According to one embodiment the intermediate image receiving member position measuring means suitably comprises a capacitive movement sensor which measures the relative movement between the intermediate image receiving member and the printhead structure by means of which the position of the intermediate image receiving member in relation to the passages/apertures is determined. The capacitive movement sensor suitably comprises at least one first at least partially conductive area and at least one second at least partially conductive area arranged at a predetermined position in relation to the printhead structure. The capacitive movement sensor also suitably comprises at least one third at least partially conductive area on the intermediate image receiving member. The first, second and third areas are preferably spatially arranged in such a way that at least once in relation to the transport of pigment particles onto the intermediate image receiving member for the formation of a pigment image the first and third areas form a first capacitor, and the second and third areas form a second capacitor in order that the capacitive movement sensor can determine a transfer function of the first and second capacitor function during the relative movement of the intermediate image receiving member and the printhead structure. The transfer function of the first and second capacitor function preferably determines the relative movement between the intermediate image receiving member and the printhead structure. The capacitive movement sensor suitably comprises a plurality of second at least partially conductive areas and a plurality of third at least partially conductive areas. The distance between adjacent second areas is suitably different from the distance between adjacent third areas. The intermediate image receiving member suitably comprises at least one separate image area intended for reception of pigment particles for formation of a pigment image thereon. The at least one second at least partially conductive area is preferably arranged in relation to the at least one separate image area.

In one embodiment according to the invention the image recording device suitably includes at least two pigment particle sources with their respective corresponding, control electrodes and passages/apertures. Whereby the intermediate image receiving member position measuring means measures the position of the intermediate image receiving means in relation to the respective passages/apertures to thereby via the control unit be able to synchronize the selective opening and closing of the respective passages/apertures through the at least one printhead structure according to the relative movement of the at least one printhead structure and the intermediate image receiving member to thereby enable the formation of a respective pigment image at a predetermined position on the intermediate image receiving member in view of the image which is to be recorded. The image recording device is preferably capable of recording color images and includes four pigment particle sources.

Further embodiments according to previously described enhancements are possible in view of the application of the invention.

Said objects are also achieved according to the invention by a method for recording an image to an information carrier. The method comprises a number of steps. In a first step pigment particles are provided from a pigment particle source. In a second step an intermediate image receiving member and a printhead structure are moved relative to each other during recording. In a third step an electrical field is created for transporting of pigment particles from the pigment particle source toward a first face of the intermediate image receiving member. In a fourth step the position of the intermediate image receiving member is measured in relation to apertures of the printhead structure to thereby be able to synchronize selective opening and closing of the apertures through the printhead structure according to the relative movement of the printhead structure and the intermediate image receiving member to thereby enable the formation of a pigment image at a predetermined position on the intermediate image receiving member in view of the image which is to be recorded. In a fifth step apertures through the printhead structure are selectively opened or closed to permit or restrict the transporting of pigment particles to thereby enable the formation of a pigment image on the first face of the intermediate image receiving member. And finally in a sixth step the pigment image is subsequently transferred to an information carrier.

Further variations of the method according to previously described enhancements are possible in view of the application of the invention.

Said objects are also achieved according to the invention by an image recording device and method for recording an image to an information carrier. The image recording device comprises a pigment particle source, a voltage source, a printhead structure, and an intermediate image receiving member. The pigment particle source provides pigment particles. The intermediate image receiving member and the printhead structure move relative to each other during recording. The intermediate image receiving member has a first face and a second face. The printhead structure is placed inbetween the pigment particle source and the first face of the intermediate image receiving member. The voltage source is connected to the pigment particle source and the back electrode to thereby create an electrical field for transport of pigment particles from the pigment particle source toward the first face of the intermediate image receiving member. The printhead structure includes control electrodes to thereby be able to selectively open or close passages/apertures through the printhead structure to permit or restrict the transport of pigment particles to thereby enable the formation of a pigment image on the first face of the intermediate image receiving member. The pigment image is subsequently transferred to an information carrier. According to the method and device of the invention the image recording device comprises a pressure changing means which can create a pressure difference on the side of the second face of the intermediate image receiving member in the vicinity of the passages/apertures. Further the intermediate image receiving member comprises a cleaning area for cleaning purposes and a separate image area intended for reception of pigment particles for formation of a pigment image thereon. The cleaning area includes at least one slot between the first face and the second face of the intermediate image receiving member. The at least one slot being intended for transferring a pressure difference through the intermediate image receiving member to thereby, in cooperation with the pressure changing means in the vicinity of the passages/apertures, be able to dislodge pigment agglomeration for the purpose of cleaning the passages/apertures.

The pressure changing means preferably creates a pressure difference on the second face of the intermediate image receiving member only when the cleaning area is in the vicinity of the passages/apertures. The pressure changing means suitably creates a pressure difference on the second face of the intermediate image receiving member along the cleaning area only when the cleaning area is in the vicinity of the passages/apertures. Suitably the cleaning area includes a plurality of slots between the first face and the second face, where at least a subset of the plurality of slots are intended for transferring a pressure difference through the intermediate image receiving member. Suitably the plurality of slots are arranged substantially in a row, the row being arranged substantially perpendicular to the direction of the relative movement between the intermediate image receiving member and the printhead structure. In some embodiments the row can suitably be arranged substantially at an angle diverging from 0° to the perpendicular to the direction of the relative movement between the intermediate image receiving member and the printhead structure.

The cleaning area preferably includes a plurality of slots between the first face and the second face, suitably at least a subset of the plurality of slots are intended for transferring a pressure difference through the intermediate image receiving member and arranged substantially in at least two rows. In some embodiments adjacent slots are suitably arranged substantially aligned in at least one row in only one dimension.

The at least one slot suitably has a substantially round opening on at least one of the first and second face of the intermediate image receiving member. In some embodiments the at least one slot suitably has a substantially elongated opening on at least one of the first and second face of the intermediate image receiving member, the elongation having long sides and a center line being equidistant from the long sides within the opening. In some of these embodiments the at least one slot is suitably arranged in such a way that the center line of the elongation is substantially in a direction parallell to the relative movement between the intermediate image receiving member and the printhead structure. In other of these embodiments the at least one slot is suitably arranged in such a way that the center line of the elongation is substantially in a direction perpendicular to the relative movement between the intermediate image receiving member and the printhead structure. In still other of these embodiments the at least one slot is suitably arranged in such a way that the center line of the elongation is substantially in a direction which is between a direction which is perpendicular to and a direction which is parallell to the relative movement between the intermediate image receiving member and the printhead structure. In some of all of these embodiments the long sides of the elongation are suitably not parallell thus creating a wide end and a narrow end. The long sides are suitably connected by substantially rounded end connections, connected by substantially straight end connections or a combination.

In some embodiments the dimension of the at least one slot is suitably greater than the magnitude of the distance between the first face of the intermediate image receiving member and the printhead structure.

In some embodiments the pressure changing means suitably creates an overpressure. In other embodiments the pressure changing means suitably creates a suction pressure. In still other embodiments the pressure changing means can suitably alternately create an overpressure and a suction pressure.

The pressure changing means can in some embodiments suitably comprises a fan for the creation of the pressure difference. In other embodiments the pressure changing means suitably comprises a volume changing means for the creation of the pressure difference, which can, for example, be a bellow or a piston.

At least part of the pressure changing means can suitably be arranged in a support for the intermediate image receiving member. The pressure changing means suitably creates the pressure difference on the side of the second face of the intermediate image receiving member via an opening of a controllable opening adjacent to the passages/apertures. The opening of the controllable opening can in some embodiments suitably be shifted in the relative direction of movement of the intermediate image receiving member while in other embodiments it is not shifted but substantially symmetrically arranged in view of the apertures that are to be cleaned by the opening in question.

Preferably the intermediate image receiving member includes a transfer belt positioned at a predetermined distance from the printhead structure, the transfer belt being substantially of uniform thickness. The thickness of the intermediate image receiving member is suitably at least partially thinner in the cleaning area compared to the thickness of the intermediate image receiving member in the image area.

The image recording device suitably includes at least two, and preferably four, pigment particle sources with corresponding control electrodes and passages/apertures on and in at least one printhead structure and where the pressure changing means can create a pressure difference on the side of the second face of the intermediate image receiving member for each one of the pigment particle sources in the vicinity of the corresponding respective passages/apertures.

Further embodiments according to previously described enhancements are possible in view of the application of the invention.

Said objects are also achieved according to the invention by a method for recording an image to an information carrier. The method comprises a number of. In a first step pigment particles from a pigment particle source area provided. In a second step an intermediate image receiving member and a printhead structure are moved relative to each other during recording. In a third step an electrical field is created for transport of pigment particles from the pigment particle source toward a first face of the intermediate image receiving member. In a third step apertures through the printhead structure are selectively opened or closed to permit or restrict the transport of pigment particles to thereby enable the formation of a pigment image on an image area on the first face of the intermediate image receiving member. In a fourth step the pigment image is subsequently transferred to an information carrier. In a fifth step a pressure difference is created on the side of the second face of the intermediate image receiving member in the vicinity of the apertures. And finally in a sixth step the pressure difference is transferred through the intermediate image receiving member by means of at least one slot between the first face and the second face of the intermediate image receiving member within a cleaning area for cleaning purposes which is separate from the image area, to thereby, in the vicinity of the apertures, be able to dislodge pigment agglomeration for the purpose of cleaning the apertures.

Further variations of the method according to previously described enhancements are possible in view of the application of the invention.

The present invention satisfies a need for increased accuracy of dot deflection control in direct electrostatic printing methods and apparatus by providing an intermediate image receiving medium allowing higher print uniformity and eliminating the drawbacks associated with the variations of paper and other information carrier properties.

The present invention relates to an image recording apparatus including an intermediate image receiving member conveyed past one or more, so called, print stations to intercept a modulated stream of toner particles from each print station. A print station includes a particle delivery unit, a particle source, such as a developer sleeve, and a printhead structure arranged between the particle source and the image receiving member. The printhead structure includes means for modulating the stream of toner particles from the particle source and means for controlling the trajectory of the modulated stream of toner particles toward the image receiving member.

According to a preferred embodiment of the present invention, the image recording apparatus comprises four print stations, each corresponding to a pigment colour, e.g. yellow, magenta, cyan, black (Y,M,C,K), disposed adjacent to an intermediate image receiving member formed of a seamless transfer belt made of a substantially uniformly thick, flexible material having high thermal resistance, high mechanical strength and stable electrical properties under a wide temperature range. The toner image is formed on the transfer belt and thereafter brought into contact with an information carrier, e.g. paper, in a fuser unit, where the toner image is simultaneously transferred to and made permanent on the information carrier upon heat and pressure. After image transfer, the transfer belt is brought in contact with a cleaning unit removing untransferred toner particles.

The present invention also relates to a direct printing method performed in consecutive print cycles, each of which includes several development periods having specific deflection modes. During each development period, control voltages are applied to control electrodes to produce electrostatic control fields which, due to control in accordance with the image information, open or close apertures through the printhead structure, thus enhancing or inhibiting the transport of toner particles from the particle source toward the intermediate image receiving member. Deflection voltages are simultaneously applied to the deflection electrodes to influence the symmetry of the electrostatic control fields to deflect the transported toner particles in predetermined directions, such that several dot locations are addressable through each aperture during each print cycle. The deflection length, i.e. the distance between a deflected dot and a central axis of the corresponding aperture, is optimized to obtain uniformly spaced dot locations across the entire width of the intermediate image receiving member.

Other objects, features and advantages of the present inventions will become more apparent from the following description when read in conjunction with the accompanying drawings in which preferred embodiments of the invention are shown by way of illustrative examples.

BRIEF DESCRIPTION OF THE DRAWINGS

The invention will now be described in more detail for explanatory, and in no sense limiting, purposes, with reference to the following drawings, wherein like reference numerals designate like parts throughout and where the dimensions in the drawings are not to sale, in which.

DESCRIPTION OF PREFERRED EMBODIMENTS

In order to clarify the method and device according to the invention, some examples of its use will now be described in connection with FIGS. 1 to 10.

Figure 1:
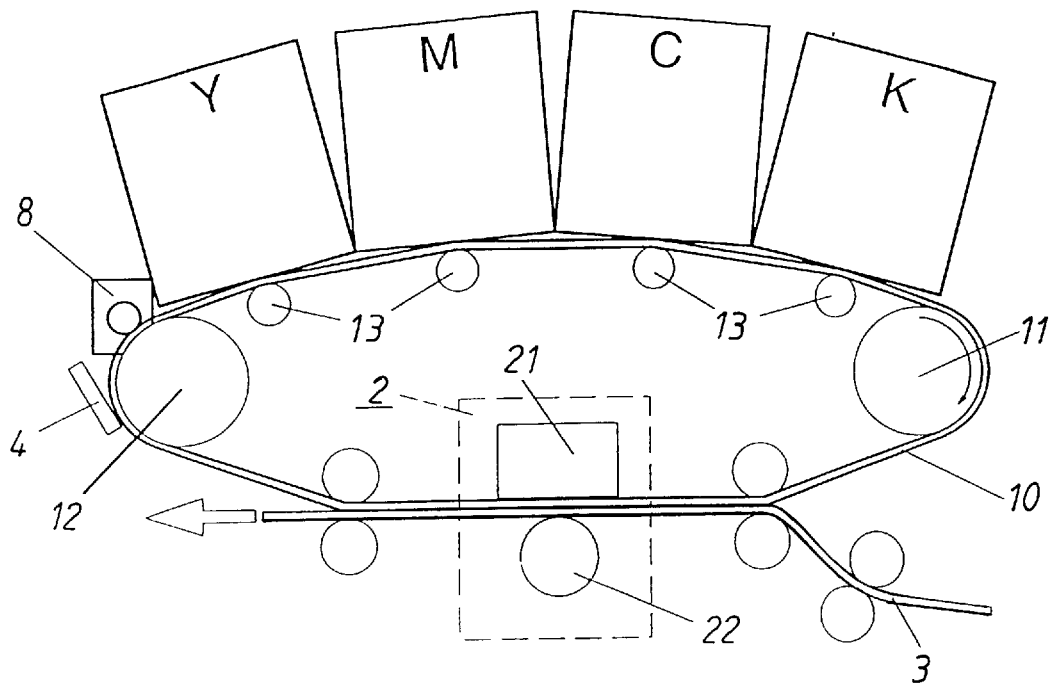
FIG. 1 is a schematic section view across an image recording apparatus according to a preferred embodiment of the invention.

FIG. 1 is a schematic section view of an image recording apparatus according to a first embodiment of the invention, comprising at least one print station, preferably four print stations (Y, M, C, K), an intermediate image receiving member, a driving roller 11, at least one support roller 12, and preferably several adjustable holding elements 13. The four print stations (Y, M, C, K) are arranged in relation to the intermediate image receiving member. The intermediate image receiving member, preferably a transfer belt 10, is mounted over the driving roller 11. The at least one support roller 12 is provided with a mechanism for maintaining the transfer belt 10 with at least a constant surface tension, while preventing transversal movement of the transfer belt 10. The preferably several adjustable holding elements 13 are for accurately positioning the transfer belt 10 at least with respect to each print station.

The driving roller 11 is preferably a cylindrical metallic sleeve having a rotational axis extending perpendicular to the belt motion and a rotation velocity adjusted to convey the transfer belt 10 at a velocity of one addressable dot location per print cycle, to provide line by line scan printing. The adjustable holding elements 13 are arranged for maintaining the surface of the transfer belt 10 at a predetermined distance from each print station. The holding elements 13 are preferably cylindrical sleeves disposed perpendicularly to the belt motion in an arcuated configuration for slightly bending the transfer belt 10 at least in the vicinity of each print station. The transfer belt 10 is slightly bent in order to, in combination with the belt tension, create a stabilization force component on the transfer belt 10. The stabilization force component is opposite in direction and preferably larger in magnitude than an electrostatic attraction force component acting on the transfer belt 10. The electrostatic attraction forces at a print station are created by different electric potentials on the transfer belt 10 and on the print station in question.

The transfer belt 10 is preferably an endless band of 30 to 200 μm thick composite material as a base. The base composite material can suitably include thermoplastic polyamide resin or any other suitable material having a high thermal resistance, such as 260° C. of glass transition point and 388° C. of melting point, and stable mechanical properties under temperatures is in the order of 250° C. The composite material of the transfer belt 10 preferably has a homogeneous concentration of filler material, such as carbon or the like, which provides a uniform electrical conductivity throughout the entire surface of the transfer belt 10. The outer surface of the transfer belt 10 is preferably overlaid with a 5 to 30 μm thick coating layer made of electrically conductive polymere material such as for instance PTFE (poly tetra fluoro ethylene), PFA (tetra flouro ethylene, perflouro alkyl vinyl ether copolymer), FEP (tetra flouro ethylene hexaflouro, propylene copolymer), silicone, or any other suitable material having appropriate conductivity, thermal resistance, adhesion properties, release properties, and surface smoothness. To further improve for example the adhesion and release properties a layer of silicone oil can be applied to either the transfer belt base or preferably onto a coating layer if it is applied onto the transfer belt base. The silicone oil is coated evenly onto the transfer belt 10 preferably in the order of 0.1 to 2 μm thick giving a consumption of silicone oil in the region of 1 centiliter for every 1000 pages. Silicone oil also reduces bouncing/-scattering of toner particles upon reception of toner particles and also increases the subsequent transfer of toner particles to an information carrier. Making use of silicone oil and especially coating of the transfer belt with silicone oil is made possible in an electrostatic printing method according to the present invention as there is no direct physical contact between a toner delivery and a toner recipient, i.e. the transfer belt.

In some embodiments the transfer belt 10 can comprise at least one separate image area and at least one of a cleaning area and/or a test area. The image area being intended for the deposition of toner particles, the cleaning area being intended for enabling the removal of unwanted toner particles from around each of the print stations, and the test area being intended for receiving test patterns of toner particles for calibration purposes. The transfer belt 10 can also in certain embodiments comprise a special registration area for use of determining the position of the transfer belt, especially an image area if available, in relation to each print station. If the transfer belt comprises a special registration area then this area is preferably at least spatially related to an image area.

The transfer belt 10 is conveyed past the four different print stations (Y, M, C, K), whereby toner particles are deposited on the outer surface of the transfer belt 10 and superposed to form a toner image. Toner images are then preferably conveyed through a fuser unit 2, comprising a fixing holder 21 arranged transversally in direct contact with the inner surface of the transfer belt 10. In some embodiments of the invention the fuser unit is separated from the transfer belt 10 and only acts on an information carrier. The fixing holder 21 includes a heating element preferably of a resistance type of e.g. molybdenium, maintained in contact with the inner surface of the transfer belt 10. As an electric current is passed through the heating element, the fixing holder 21 reaches a temperature required for melting the toner particles deposited on the outer surface of the transfer belt 10. The fuser unit 2 further comprises a pressing roller 22 arranged transversally across the width of the transfer belt 10 and facing the fixing holder 21. An information carrier 3, such as a sheet of plain, untreated paper or any other medium suitable for direct printing, is fed from a paper delivery unit (not shown) and conveyed between the pressing roller 22 and the transfer belt 10. The pressing roller 22 rotates with applied pressure to the heated surface of the fixing holder 21 whereby the melted toner particles are fused on the information carrier 3 to form a permanent image. After passage through the fusing unit 2, the transfer belt is brought in contact with a cleaning element 4, such as for example a replaceable scraper blade of fibrous material extending across the width of the transfer belt 10 for removing all untransferred toner particles. If the transfer belt 10 is to be coated with silicone oil or the like, then after the cleaning element 4, and before the printing stations, the transfer belt 10 is brought into contact with a coating application element 8 for evenly coating the transfer belt with silicone oil or the like.

Figure 2:
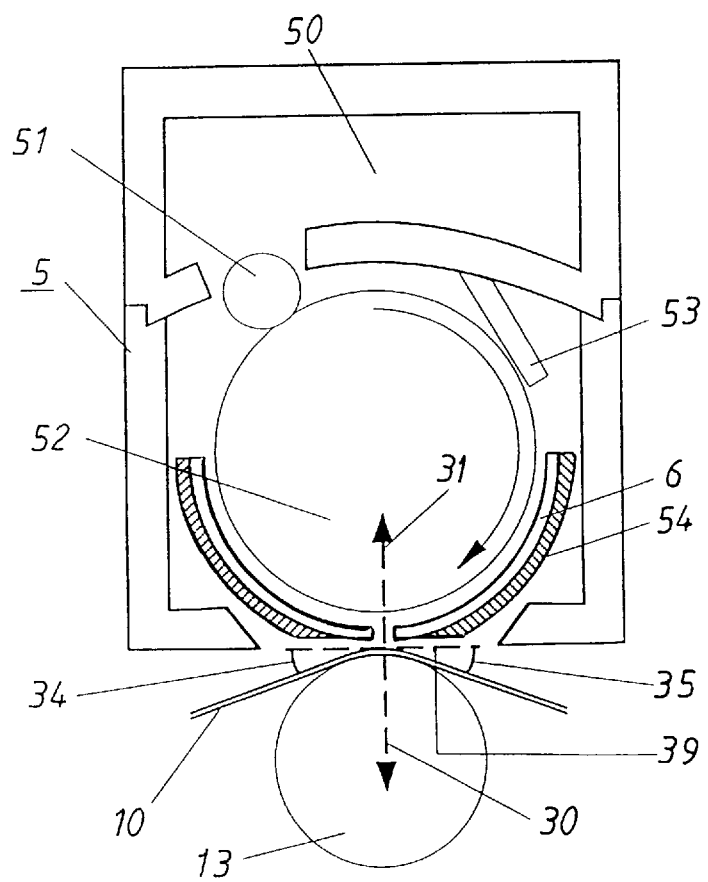
FIG. 2 is a schematic section view across a particular print station of the image recording apparatus shown in FIG. 1.

FIG. 2 is a schematic section view of a print station in, for example, the image recording apparatus shown in FIG. 1. A print station includes a particle delivery unit 5 preferably having a replaceable or refillable container 50 for holding toner particles, the container 50 having front and back walls, a pair of side walls and a bottom wall having an elongated opening extending from the front wall to the back wall and provided with a toner feeding element (not shown) disposed to continuously supply toner particles to a developer sleeve 52 through a particle charging member. The particle charging member is preferably formed of a supply brush 51 or a roller made of or coated with a fibrous, resilient material. The supply brush 51 is brought into mechanical contact with the peripheral surface of the developer sleeve 52, for charging particles by contact charge exchange due to triboelectrification of the toner particles through frictional interaction between the fibrous material on the supply brush 51 and any suitable coating material of the developer sleeve 52. The developer sleeve 52 is preferably made of metal coated with a conductive material, and preferably has a substantially cylindrical shape and a rotation axis extending parallel to the elongated opening of the particle container 50. Charged toner particles are held to the surface of the developer sleeve 52 by electrostatic forces essentially proportional to $(Q/D)^2$, where Q is the particle charge and D is the distance between the particle charge center and the boundary of the developer sleeve 52. Alternatively, the charging unit may additionally comprise a charging voltage source (not shown), which supply an electric field to induce or inject charge to the toner particles. Although it is preferred to charge particles through contact charge exchange, the method can be performed by using any other suitable charge unit, such as a conventional charge injection unit, a charge induction unit or a corona charging unit, without departing from the scope of the present invention.

A metering element 53 is positioned proximate to the developer sleeve 52 to adjust the concentration of toner particles on the peripheral surface of the developer sleeve 52, to form a relatively thin, uniform particle layer thereon. The metering element 53 may be formed of a flexible or rigid, insulating or metallic blade, roller or any other member suitable for providing a uniform particle layer thickness. The metering element 53 may also be connected to a metering voltage source (not shown) which influence the triboelectrification of the particle layer to ensure a uniform particle charge density on the surface of the developer sleeve 52.

The developer sleeve 52 is arranged in relation with a support device 54 for supporting and maintaining the printhead structure 6 in a predetermined position with respect to the peripheral surface of the developer sleeve 52. The support device 54 is preferably in the form of a trough-shaped frame having two side walls, a bottom portion between the side walls, and an elongated slot arranged through the bottom portion, extending transversally across the print station, parallel to the rotation axis of the developer sleeve 52. The support device 54 further comprises means for maintaining the printhead structure in contact with the bottom portion of the support device 54, the printhead structure 6 thereby bridging the elongated slot in the bottom portion.

The transfer belt 10 is preferably slightly bent partly around each holding element 13 in order to create a stabilization force component 30. The stabilization force component 30 is intended to counteract a field force component 31 which is acting on the transfer belt. The field force component 31 is a resultant of the electrostatic attraction forces acting on the transfer belt 10 due to different electric potentials on the transfer belt 10 and on the print station in question. The stabilization force component 30 is directed in a direction opposite the field force component 31 and preferably also at least slightly larger in magnitude than the magnitude of the field force component 31. If the field force component 31 is not counteracted it can cause distance fluctuations between the transfer belt 10 and the printhead structure 6 which can cause a degradation in print quality. The stabilization force component 30 is created by the slight bending of the transfer belt 10 in combination with the tension of the transfer belt 10. The transfer belt 10 is bent around the holding element 13 in such a way that two angles 34, 35, at least one of which is greater than zero (i.e. at most one angle equal to zero), are created to the transfer belt 10 from a reference plane 39. The reference plane 39 being substantially perpendicular to an imaginary line/plane that extends between the center of the developer sleeve 52 and the holding element 13. Preferably the imaginary line/plane also separate the two angles 34, 35. The two angles 34, 35 are preferably both greater than zero and in the region between 0° and 10°.

Figure 3:
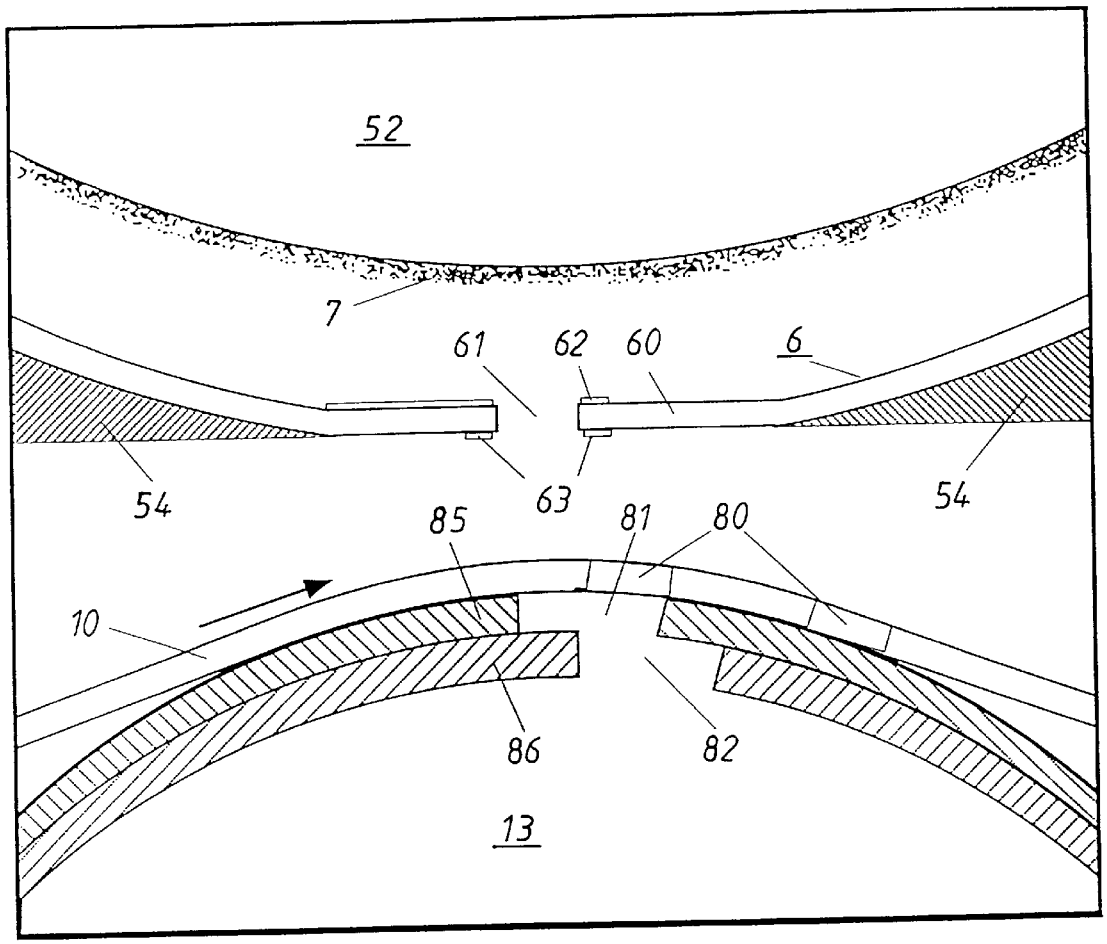
FIG. 3 is an enlargement of FIG. 2 showing the print zone corresponding to a particular print station.

FIG. 3 is an enlargement of the print zone in a print station of, for example, the image recording apparatus shown in FIG. 1. The printhead structure 6 is preferably formed of an electrically insulating substrate layer 60 made of flexible, non-rigid material such as polyamide or the like. The printhead structure 6 is positioned between the peripheral surface of the developer sleeve 52 and the bottom portion of the support device 54. The substrate layer 60 has a top surface facing the toner layer 7 on the peripheral surface of the developer sleeve 52. The substrate layer 60 has a bottom surface facing the the bottom portion of the support device 54. Further, the substrate layer 60 has a plurality of apertures 61 arranged through the substrate layer 60 in the part of the substrate layer 60 overlying the elongated slot in the bottom portion of the support device 54. The printhead structure 6 further includes a first printed circuit arranged on the top surface on the substrate layer 60 and a second printed circuit arranged on the bottom surface of the substrate layer 60. The first printed circuit includes a plurality of control electrodes 62, each of which, at least partially, surrounds a corresponding aperture 61 in the substrate layer 60. The second printed circuit preferably includes a first and a second set of deflection electrodes 63 spaced around first and second portions of the periphery of the apertures 61 of the substrate layer 60.

The apertures 61 and their surrounding area will under some circumstances need to be cleaned from toner particles which agglomerate there. In some embodiments of the invention the transfer belt 10 advantageously comprises at least one cleaning area for the purpose of cleaning the apertures 61 and the general area of the apertures 61. The cleaning, according to these embodiments, works by the principle of flowing air (or other gas). A pressure difference, compared to the air pressure in the vicinity of the apertures, is created on the side of the transfer belt 10 that is facing away from the apertures 61. The pressure difference is at least created during part of the time when the cleaning area is in the vicinity of the apertures 61 of the print station in question during the transfer belt's 10 movement. The pressure difference can either be an over pressure, a suction pressure or a sequential combination of both, i.e. the cleaning is performed by either blowing, suction, blowing first then suction, suction first then blowing, or some other sequential combination of suction and blowing. The pressure difference is transferred across the transfer belt 10 by means of the cleaning area comprising at least one slot/hole 80 through the transfer belt 10. The cleaning area preferably comprises at least one row of slots 80, and more specifically two to eight interlaced rows of slots 80, and The slots can advantageously be in the order of 3 to 5 mm across. The pressure difference appears on the holding element 13 side of the transfer belt 10 through a transfer passage 81 through an outer sleeve 85 of the holding element 13. The transfer passage 81 can advantageously suitably extend transversally across the printhead structure as an elongated slot with a width, in the direction of the transfer belt 10 movement, that is equal to or greater than the minimum distance between the printhead structure 6 and the transfer belt 10. In some embodiments it can be advantageous to have a controllable passage 82 which by means of, for example, a movable inner sleeve 86 can open and close access of the pressure difference to the transfer passage 81. Thereby a suction pressure will not increase the transfer belt's friction on the holding element 13 more than necessary. The controllable passage 82 will preferably open and close in synchronization with the movement of the transfer belt 10 to thereby coincide its openings with the passage of the cleaning area of the transfer belt 10. The means for creating the pressure difference it not shown and can suitably be a fan, bellows, a piston, or a some other suitable means for creating a pressure difference. In some embodiments according to the invention the transfer passage 81 is substantially located symmetrically in relation to the apertures. In other embodiments according to the invention the transfer passage 81 is shifted in the direction of movement of the transfer belt 10.

Figure 4:
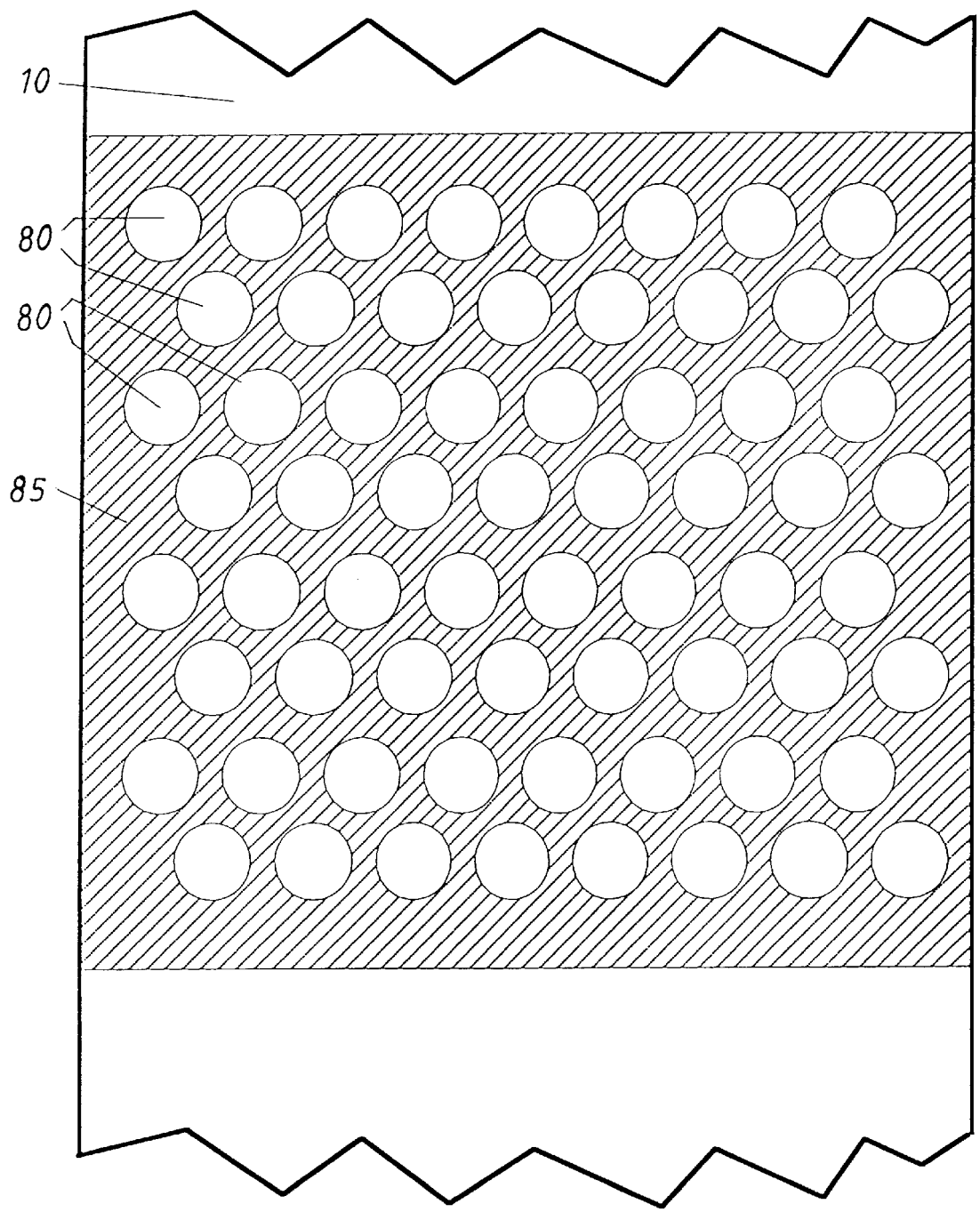
FIG. 4 is a schematic plan view of the top side of part of a transfer belt showing a cleaning area.

FIG. 4 shows an example of holes 80 in a plurality of interlaced rows within a cleaning area 85 of the transfer belt 10. The number of holes/slots, their size and design will depend on the specific applications. A preferable design is elongated slots in at least two interlaced rows.

Figure 5A:
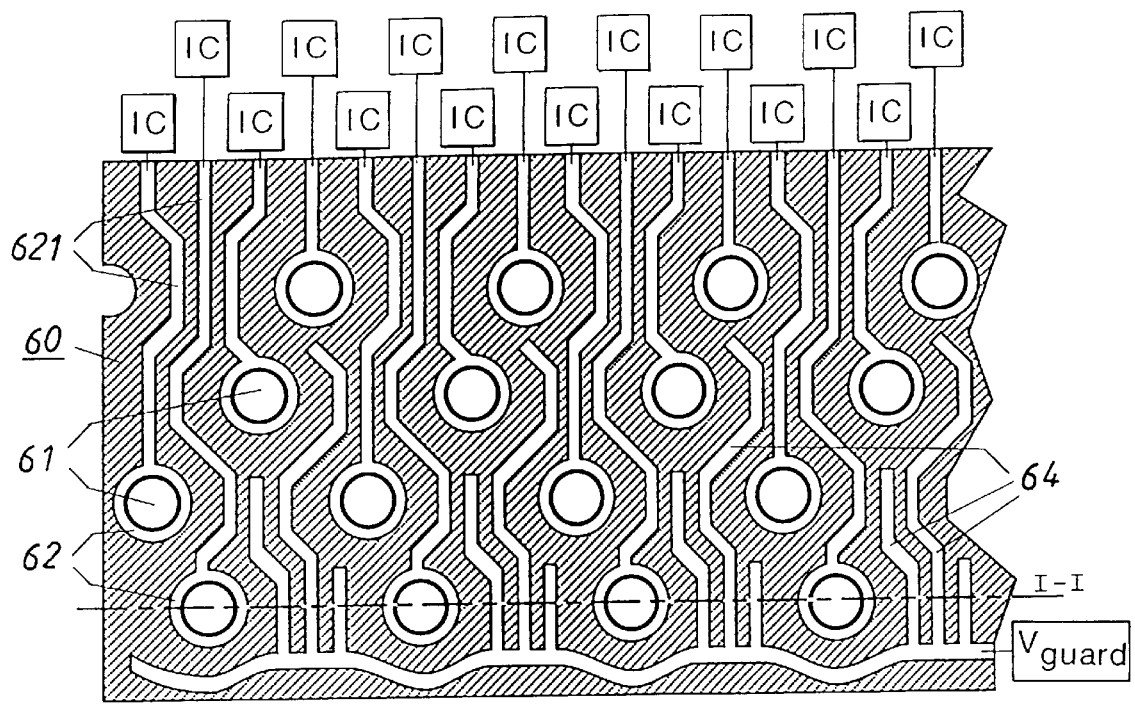
FIG. 5a is a schematic plan view of the top side of a printhead structure used in a print station such as that shown in FIG. 2.
Figure 5B:
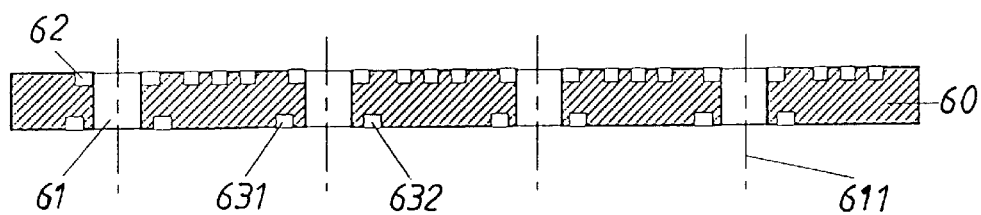
FIG. 5b is a schematic section view along the section line I—I through the printhead structure shown in FIG. 5a, FIG. 5c is a schematic plan view of the bottom side of the printhead structure shown in FIG. 5a, FIG. 6 is a schematic view of a single aperture and its corresponding control electrode and deflection electrodes.
Figure 5C:
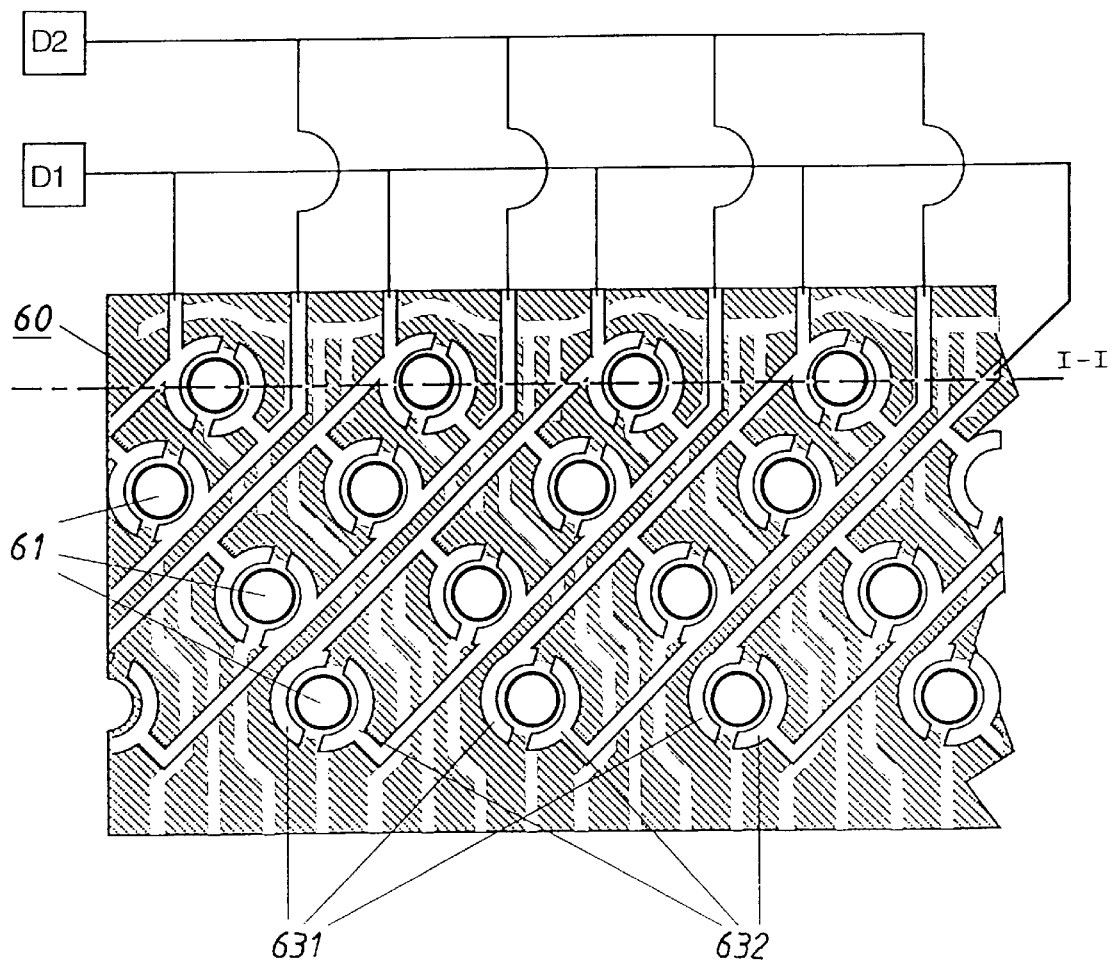

Although, a printhead structure 6 can take on various embodiments without departing from the scope of the present invention, a preferred embodiment of the printhead structure will be described hereinafter with reference to FIGS. 5a, 5b and 5c. A plurality of apertures 61 are arranged through the substrate layer 60 in several aperture rows extending transversally across the width of the print zone, preferably at a substantially right angle to the motion of the transfer belt. The apertures 61 preferably have a circular cross section with a central axis 611 extending perpendicularly to the substrate layer 60 and suitably a diameter in the order of 160 μm. Each aperture 61 is surrounded by a control electrode 62 having a ring-shaped part circumscribing the periphery of the aperture 61, with a symmetry axis coinciding with the central axis 611 of the aperture 61 and an inner diameter which is equal or sensibly larger than the aperture diameter. Each control electrode 62 is connected to a control voltage source (IC driver) through a connector 621. As apparent in FIG. 5a, the printhead structure further preferably includes guard electrodes 64, preferably arranged on the top surface of the substrate layer 60 and connected to a guard potential (Vguard) aimed to electrically shields the control electrodes 62 from one another, thereby preventing undesired interaction between the electrostatic fields produced by two adjacent control electrodes 62. Each aperture 61 is related to a first deflection electrode 631 and a second deflection electrode 632 spaced around a first and a second segment of the periphery of the aperture 61, respectively. The deflection electrodes 631, 632 are preferably semicircular or crescent-shaped and disposed symmetrically on each side of a deflection axis extending diametrically across the aperture at a predetermined deflection angle to the motion of the transfer belt, such that the deflection electrodes substantially border on a first and a second half of the circumference of their corresponding aperture 61, respectively. All first and second deflection electrodes 631, 632 are connected to a first and a second deflection voltage source D1, D2, respectively.

Figure 6:
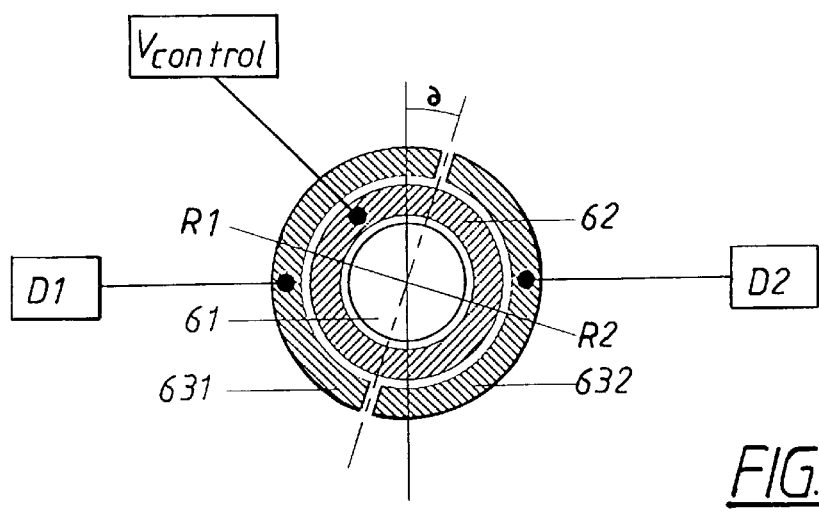

FIG. 6 is a schematic view of a single aperture 61 and its corresponding control electrode 62 and deflection electrodes 631, 632. Toner particles are deflected in a first deflection direction R1 when D1<D2, and an opposite direction R2 when D1>D2. The deflection angle δ is chosen to compensate for the motion of the transfer belt 10 during the print cycle, in order to be able to obtain two or more transversally aligned dots.

Figure 7A:
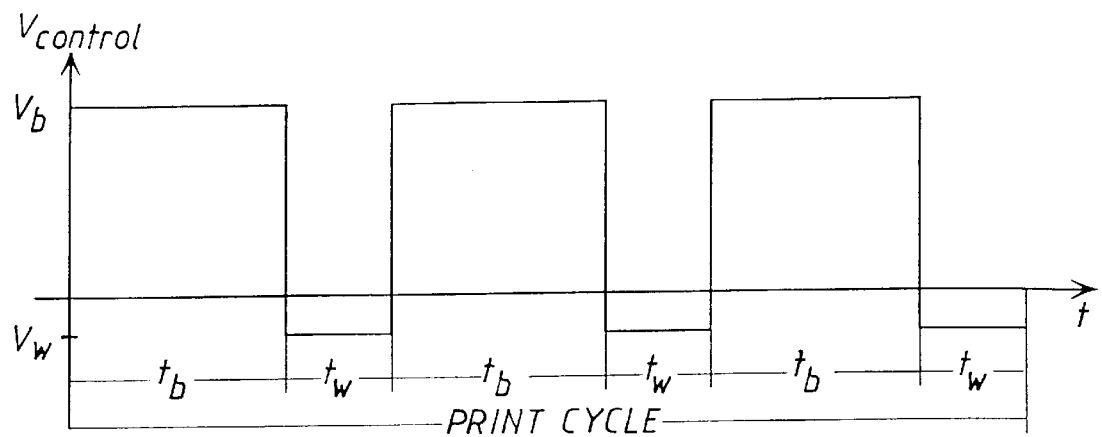
FIG. 7a illustrates a control voltage signal as a function of time during a print cycle having three subsequent development periods.
Figure 7B:
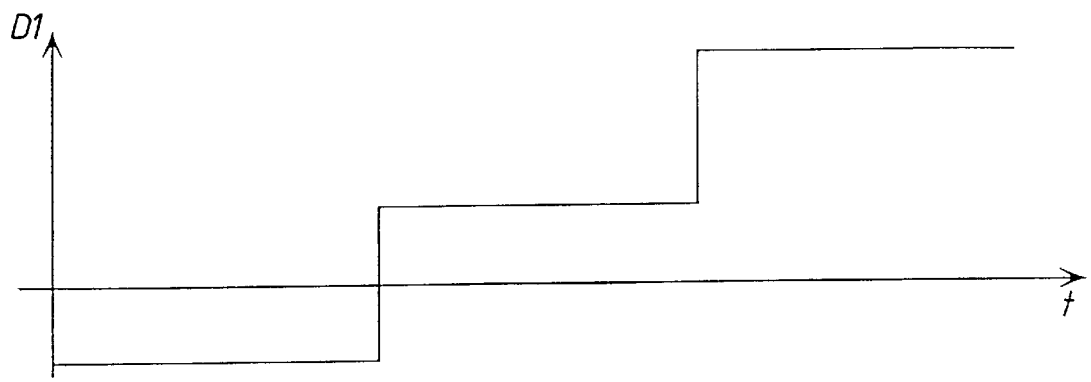
FIG. 7b illustrates a first deflection voltage signal as a function of time during a print cycle having three subsequent development periods
Figure 7C:
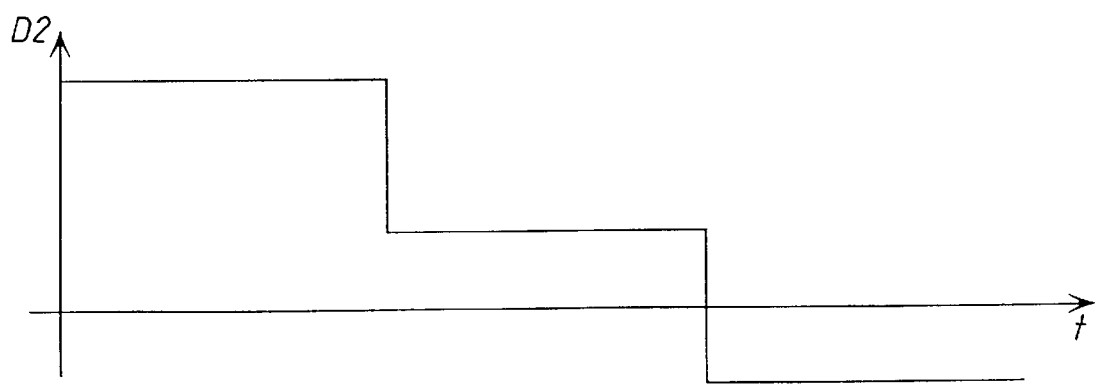
FIG. 7c illustrates a second deflection voltage signal as a function of time during a print cycle having three subsequent development periods

A preferred embodiment of a dot deflection control function is illustrated in FIGS. 7a, 7b and 7c respectively showing the control voltage signal (Vcontrol), a first deflection voltage D1 and a second deflection voltage D2, as a function of time during a single print cycle. According to some embodiments of the invention and as illustrated in the figure, printing is performed in print cycles having three subsequent development periods for addressing three different dot locations through each aperture. In other embodiments each print cycle can suitably have fewer or more addressable dot locations for each aperture. In still further embodiments each print cycle has a controllable number of addressable dot locations for each aperture. During the whole print cycle an electric background field is produced between a first potential on the surface of the developer sleeve and a second potential on the back electrode, to enable the transport of toner particles between the developer sleeve and the transfer belt. During each development period, control voltages are applied to the control electrodes to produce a pattern of electrostatic control fields which due to control in accordance with the image information, selectively open or close the apertures by influencing the electric background field, thereby enhancing or inhibiting the transport or toner through the printhead structure. The toner particles allowed to pass through the opened apertures are then transported toward their intended dot location along a trajectory which is determined by the deflection mode.

The examples of control function shown in FIGS. 7a, 7b and 7c illustrates a control function wherein the toner particles have negative polarity charge. As is apparent from FIG. 7a, a print cycle comprises three development periods tb, each followed by a recovering period tw during which new toner is supplied to the print zone. The control voltage pulse (Vcontrol) can be amplitude and/or pulse width modulated, to allow the intended amount of toner particles to be transported through the aperture. For instance, the amplitude of the control voltage varies between a non-print level $V_w$ or approximately −50V and a print level $V_b$ in the order of +350V, corresponding to full density dots. Similarly, the pulse width can be varied from 0 to tb. As apparent from FIGS. 7b and 7c, the amplitude difference between D1 and D2 is sequentially modified for providing three different toner trajectories, i.e. dot positions, during each print cycle. The amplitudes of D1 and D2 are modulated to apply converging forces on the toner to obtain smaller dots. Utilizing this method enables, for example, 60 μm dots to be obtained utilizing 160 μm apertures. Suitably the size of the dots are adjusted in accordance with the dot density (dpi) and thus also dynamically with the number of dot locations each aperture is to address.

Figure 8A:
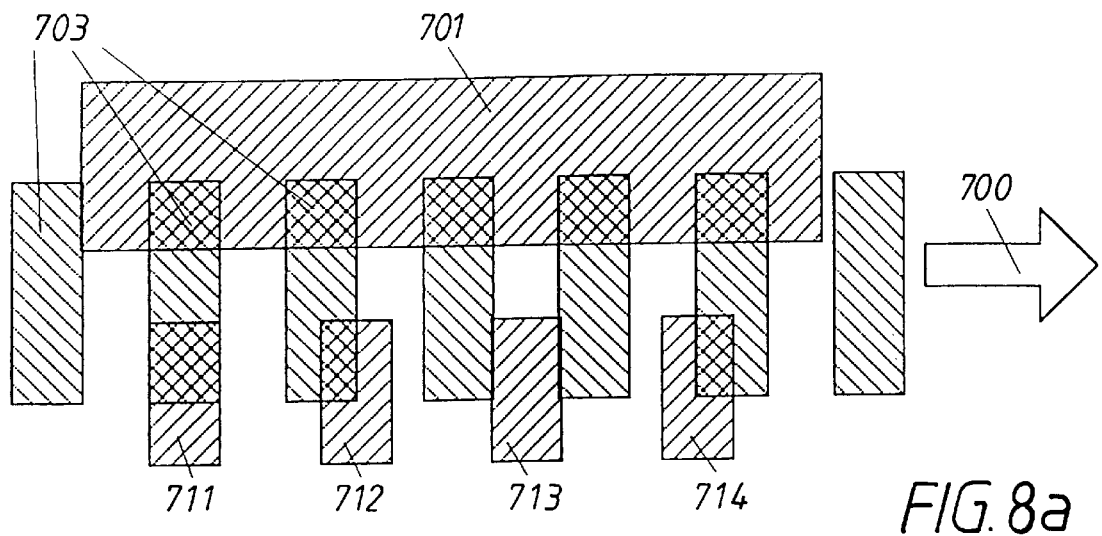
FIG. 8a illustrates conductive areas on the printhead structure and on the transfer belt for position determination at a first position of the transfer belt.
Figure 8B:
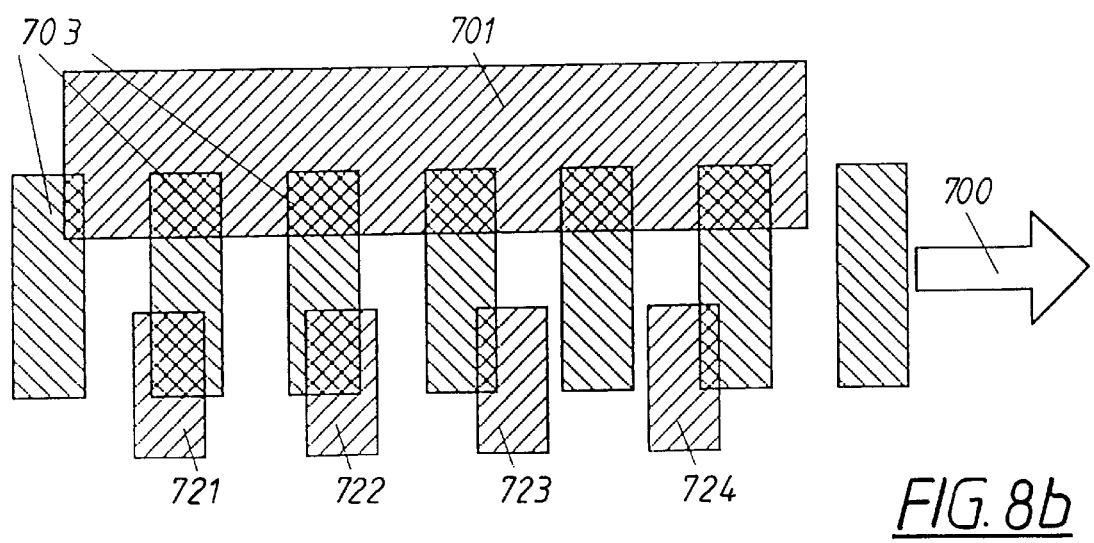
FIG. 8b illustrates conductive areas on the printhead structure and on the transfer belt for position determination at a second position of the transfer belt.
Figure 8C:
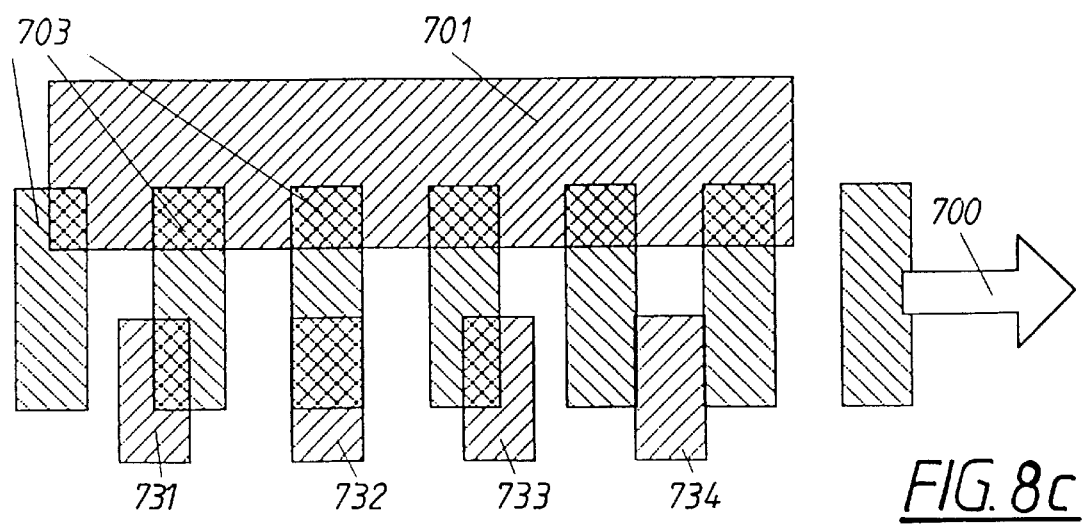
FIG. 8c illustrates conductive areas on the printhead structure and on the transfer belt for position determination at a third position of the transfer belt.

FIGS. 8a, 8b, and 8c illustrate conductive areas/regions/plates on the printhead structure and on or in the transfer belt for position determination. The FIGS. 8a, 8b, and 8c illustrate the conductive areas/regions/plates at a first, second, and third position respectively of the transfer belt. A position determination means according to the invention comprises a first number of conductive areas/regions, transfer plates 703, on or in the transfer belt. According to the figures in question the transfer belt has a direction of movement to the right as illustrated by the arrows 700. The movements of the transfer belt between FIGS. 8a and 8b, and between FIGS. 8b and 8c are substantially the same for illustrative purposes. The position determination means further comprises a large conductive area/region, an input plate 701, intended for input of a measurement signal. The position determination means further comprises at least one conductive area/region, output plate(s) 711, 712, 713, 714, 721, 722, 723, 724, 731, 732, 733, 734, intended for measurement of the transferred measurement signal. The position determination means preferably comprises at least two output plates 711, 712, 713, 714, 721, 722, 723, 724, 731, 732, 733, 734. The center to center distance between two adjacent output plates 711, 712, 713, 714, 721, 722, 723, 724, 731, 732, 733, 734 preferably differ from the center to center distance between two adjacent transfer plates 703 of the transfer belt. The output plates 711, 712, 713, 714, 721, 722, 723, 724, 731, 732, 733, 734 are positioned in a fixed predetermined spatial location in relation to at least one aperture. The input plate 701 is positioned in a location so that it at least partially overlaps the transfer plates 703 that are passing by the movement of the transfer belt thereby creating a first capacitance to each transfer plate 703 that it overlaps. The output plates 711, 712, 713, 714, 721, 722, 723, 724, 731, 732, 733, 734 at least partially overlap the transfer plates 703 that are passing by the movement of the transfer belt thereby creating a capacitance between each output plate 711, 712, 713, 714, 721, 722, 723, 724, 731, 732, 733, 734 and the corresponding transfer plate 703 that is more or less overlapped. Thereby a transfer of the measurement signal can occur between the input plate 701 and a transfer plate 703 by means of a first capacitance and then between the transfer plate 703 in question and an output plate 711, 712, 713, 714, 721, 722, 723, 724, 731, 732, 733, 734 by means of a second capacitance with the second capacitance varying in size depending on the changing overlap due to the movement of the transfer belt. Thus the measurement signal has to have a suitable amplitude and frequency to transfer from the input plate 701 across the first and second capacitance functions created by the plates/conductive areas and to thereby be measureable at an output plate 711, 712, 713, 714, 721, 722, 723, 724, 731, 732, 733, 734. As can be seen in FIG. 8a a first output plate 711 covers a transfer plate 703 as much as it will ever do, thus it is said to cover it to a 100%. The second output plate 712 covers only 50%, the third output plate 713 does not cover anything, i.e. 0%, and the fourth illustrated output plate 714 covers 50%. The reason for the different coverage by the output plates 711, 712, 713, 714 is due to the different center to center distances of the output plates 711, 712, 713, 714, 721, 722, 723, 724, 731, 732, 733, 734 compare with the transfer plates 703. In FIG. 8b, when the transfer belt has moved 700 a little, the first output plate 721 covers 75%, the second output plate 722 covers 75%, the third output plates 723 covers 25%, and the fourth output plate covers 25%. In FIG. 8c, when the transfer belt has moved 700 a little further, the first output plate 731 covers 50%, the second output plate 732 coves 100%, the third output plate 733 covers 50%, and the fourth output plate covers 0%. Thus the first output plate 711, 721, 731 has had a decrease in coverage, the second output plate 712, 722, 732 has had an increase in coverage, the third output plate 713, 723, 733 has had an increase in coverage, and the fourth output plate 714, 724, 734 has had a decrease in coverage. The change in coverage changes the capacitance of the second capacitance function and the level of the measurement signal will thus change in accordance with the change in coverage. The relative position between the transfer plates 703 and the output plates 711, 712, 713, 714, 721, 722, 723, 724, 731, 732, 733, 734 can thus be measured very accurately and the absolute position can be measured by counting the number of transfer plates 703 that passes. The advantage of having a plurality of output plates 711, 712, 713, 714, 721, 722, 723, 724, 731, 732, 733, 734 arranged properly is that there will always be at least one that outputs the measuring signal in the advantageous linear range. A structure of the input plate 701 and output plates 711, 712, 713, 714, 721, 722, 723, 724, 731, 732, 733, 734, can be repeated, with a large common input plate 701 or individual input plates 701, for each row of apertures, multiple of rows of apertures, each printhead structure, or each print station depending on the specific embodiment of the invention in a particular application.

Figure 9A:
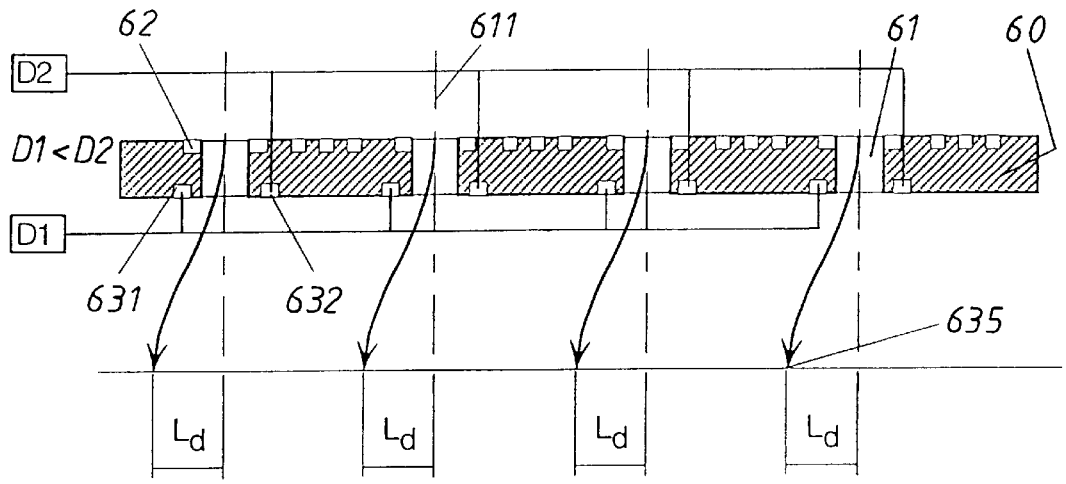
FIG. 9a illustrates the transport trajectory of toner particles through the printhead structure shown in FIGS. 5a,b,c according to a first deflection mode wherein D1<D2.
Figure 9B:
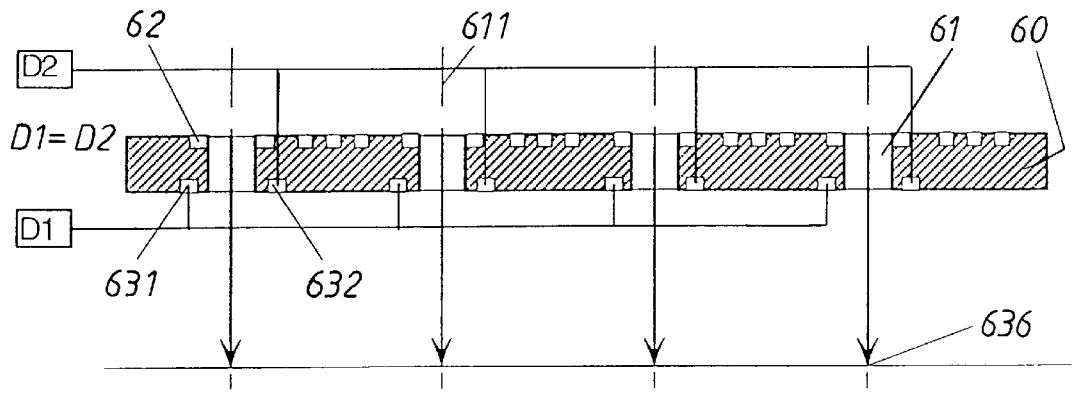
FIG. 9b illustrates the transport trajectory of toner particles through the printhead structure shown in FIGS. 5a,b,c, according to a second deflection mode wherein D1=D2.
Figure 9C:
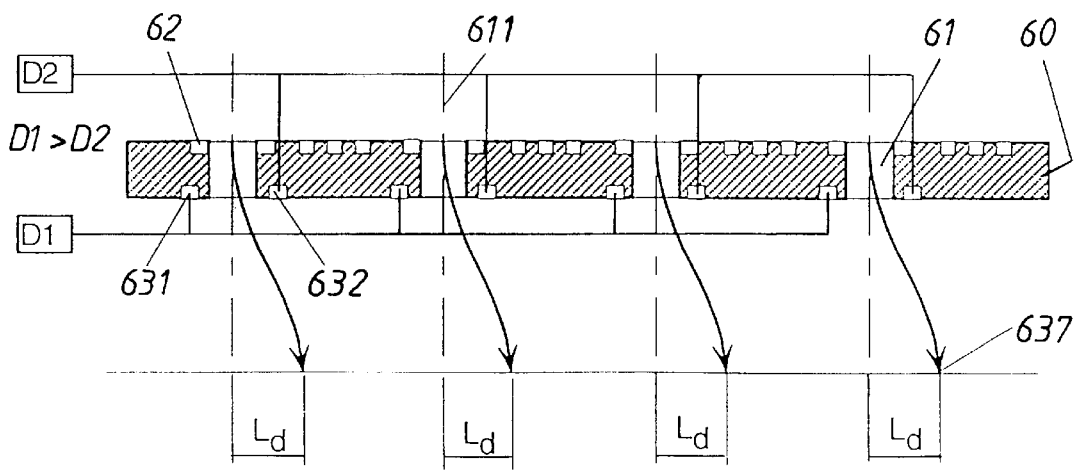
FIG. 9c illustrates the transport trajectory of toner particles through the printhead structure shown in FIGS. 5a,b,c, according to a third deflection mode wherein D1>D2.

FIGS. 9a, 9b and 9c illustrate the toner trajectories in three subsequent deflection modes. The FIGS. 9a, 9b and 9c illustrate a cross section of a substrate layer 60 with apertures 61 with corresponding control electrodes 62. Also illustrated are deflection voltages D1 and D2 that are connected to respective deflection electrodes 631, 632. During a first development period illustrated in FIG. 9a, the modulated stream of toner particles is deflected to the left by producing a first amplitude difference (D1<D2) between both deflection voltages. The amplitude difference is adjusted to address dot locations 635 located at a deflection length $L_d$ to the left of the central axes 611 of the apertures 61. During a second development period illustrated in FIG. 9b, the deflection voltages have equal amplitudes (D1=D2) to address undeflected dot locations 636 coinciding with the central axis 611 of the apertures 61. During a third development period illustrated in FIG. 9c, the modulated stream of toner particles is deflected to the right by producing a second amplitude difference (D1>D2) between both deflection voltages. The amplitude difference is adjusted to address dot locations 637 located at a deflection length $L_d$ to the right of the central axes 611 of the apertures 61.

Figure 10A:
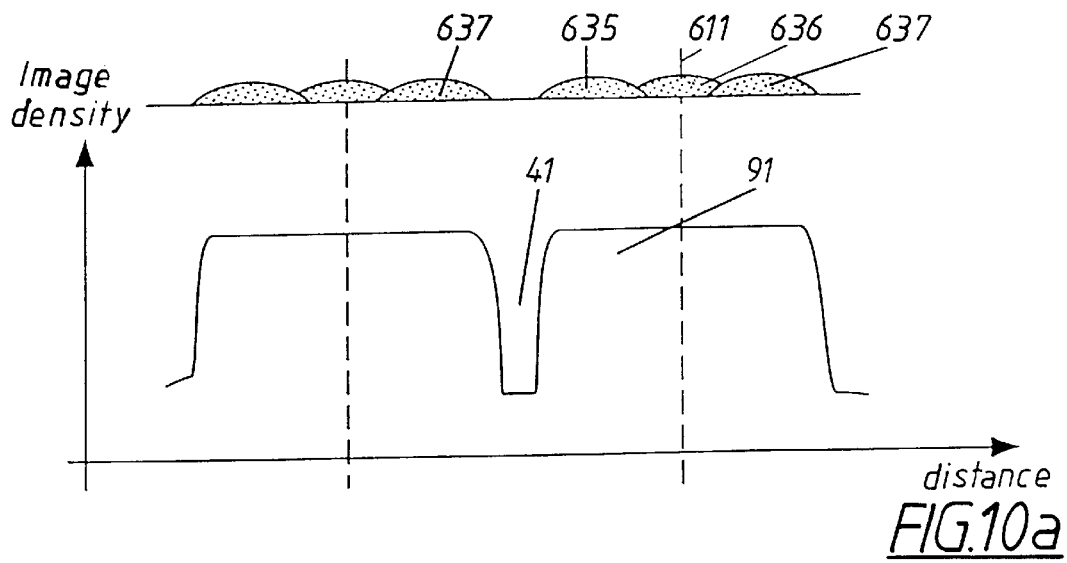
FIG. 10a illustrates deposited toner particles and their density, trajected with a too small deflection voltage difference according to FIGS. 9a,b,c, from a printhead structure such as that shown in FIGS. 5a,b,c.
Figure 10B:
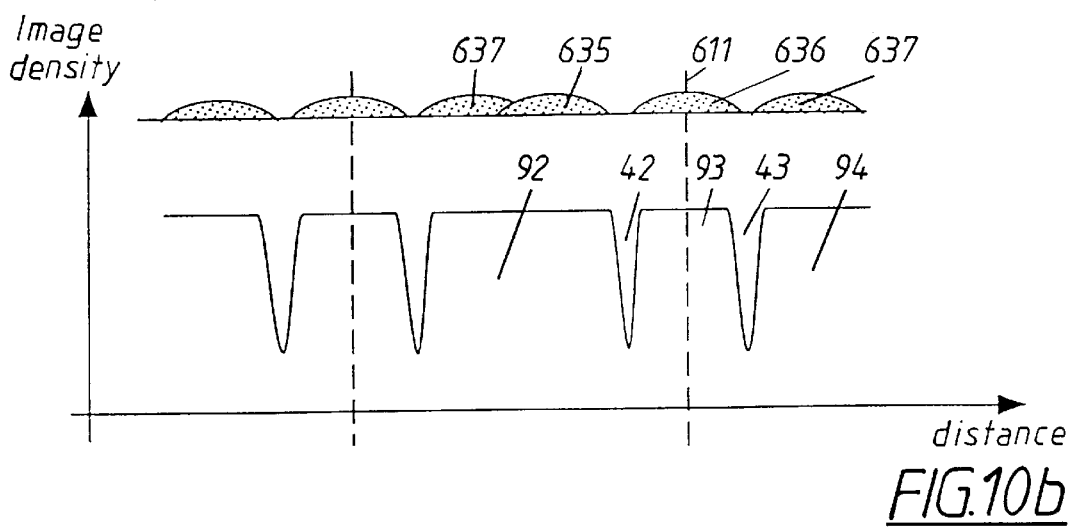
FIG. 10b illustrates deposited toner particles and the density trajected with a too large deflection voltage difference according to FIGS. 9a,b,c, from a printhead structure such as that shown in FIGS. 5a,b,c.
Figure 10C:
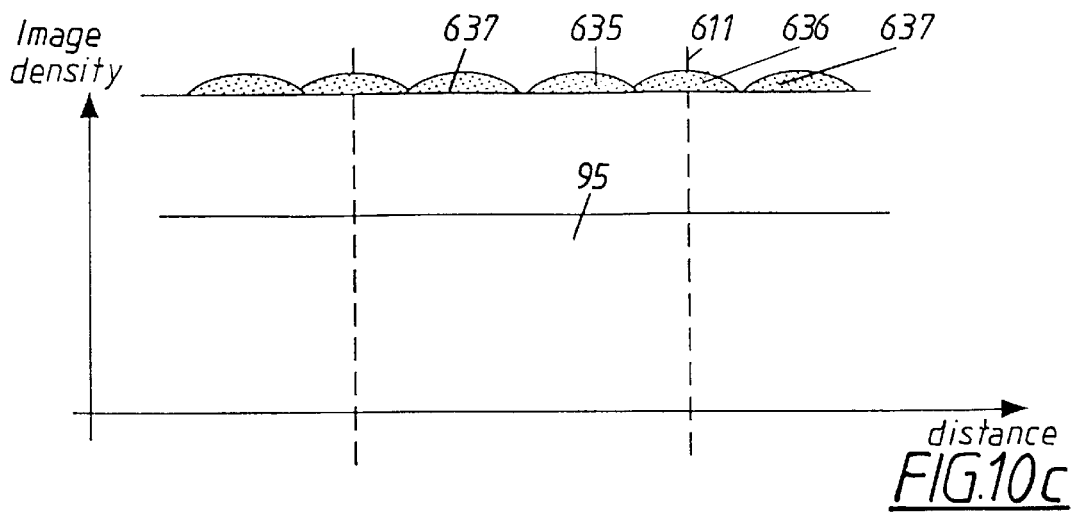
FIG. 10c illustrates deposited toner particles and their density, trajected with a substantially correct deflection voltage difference according to FIGS. 9a,b,c, from a printhead structure such as that shown in FIGS. 5a,b,c.

FIGS. 10a, 10b, and 10b illustrates deposited toner particles and their density, trajected with a too small, too large and substantially correct deflection voltage difference respectively. The toner particles are trajected, for example, according to FIGS. 9a, 9b, 9c, from a printhead structure such as that shown in FIGS. 5a, 5b, 5c. FIG. 10a illustrates toner particles 635, 636, 637 trajected onto, for example, a transfer belt and their resulting density distribution when a deflection voltage difference has been to small. According to the example three addressable dots per aperture are shown, as described previously, more or fewer dots per aperture are possible. As can be seen from the density diagram there is quite a large dip 41 in the density of the recorded toner particle dots 635, 636, 637 in comparison to an average density 91. The leftmost dot 635 leaves a gap to the rightmost dot 637 of the adjacent aperture resulting in the density dip 41. The rightmost dot 637 overlaps the center dot 636 as does the leftmost dot 635. It is the rightmost 637 and leftmost 635 that are in the wrong position, the center 636 dot will always be substantially along the center axis 611 where it should be. FIG. 10b illustrates the situation when the deflection voltage difference has been to large, thus resulting in spreading out of the rightmost dots 637 and of the leftmost dots 635 to much away from the center dots 636 and actually resulting in an overlap of the leftmost dots 635 and the rightmost dots 637 of respective adjacent apertures and thereby leaving several density dips 42, 43 in comparison to an average density 92, 93, 94. FIG. 10c illustrates the situation when the deflection voltage difference has been at its substantially optimal value leaving all of the dots 635, 636, 637 substantially at their predetermined places which results in a substantially even density 95 accross the dots.

According to the invention this difference in density is used to enable an automatic calibration of the deflection voltage difference. The smaller the deflection voltage difference is the greater the dip 41 according to FIG. 10a will become. An increase in the deflection voltage difference will decrease the size of the dip 41 until it has disappeared completely. The density across the dots will then have the appearance according to FIG. 10c, i.e. the deflection voltage difference is, at least, substantially correct. If the deflection voltage difference is increased even further, the density across the dots will break appart again, but this time according to FIG. 10b with two dips 42, 43 per aperture. The deflection voltage difference has to be decreased again so that a density 95 across the dots will have an appearance according to FIG. 10c again. According to the invention a test pattern is used, either one that happens to appear during normal printing or one that is printed for the purpose of adjusting the deflection voltage difference. If a test pattern is deliberately printed then this can suitably be done on the transfer belt on the image area or if available on a specially designated test area. The test pattern is analysed by an appropriate measurement method which suitable can be optically, magnetically to thereby measure the optical density, thickness, capacitance, flux across the test pattern. Preferably the optical density of the test pattern is optically measured across the test pattern. The result of the measurement is compared with an expected optimum value to thereby create a deflection feedback signal which can adjust the deflection voltage difference to an optimum value. This can be performed at regular or irregular intervals, such as between every page, every 1000 pages, or every hour, or on demand from, for example, the user or a environmental sensor, or at every power on.

The invention is not limited to the embodiments described above but may be varied within the scope of the appended patent claims.

What is claimed is:

1. An image recording device for recording an image to an information carrier, the image recording device including a pigment particle source, a voltage source, a printhead structure, a control unit, and an intermediate image receiving member, the pigment particle source providing pigment particles, the intermediate image receiving member and the printhead structure are moving relative to each other during recording, the intermediate image receiving member having a first face and a second face, the printhead structure being placed in between the pigment particle source and the first face of the intermediate image receiving member, the voltage source being connected to the pigment particle source and a back electrode thereby creating an electrical field for transport of pigment particles from the pigment particle source toward the first face of the intermediate image receiving member, the printhead structure including control electrodes connected to the control unit to thereby selectively open or close apertures through the printhead structure to permit or restrict the transport of pigment particles to thereby enable formation of a pigment image on the first face of the intermediate image receiving member, which pigment image is subsequently transferred to an information carrier, wherein the image recording device comprises an intermediate image receiving member position measuring means for measuring the position of the intermediate image receiving member in relation to the apertures to, in cooperation with the control unit synchronize the selective opening and closing of the apertures through the printhead structure according to a relative movement of the printhead structure and the intermediate image receiving member to thereby enable the formation of a pigment image at a predetermined position on the intermediate image receiving member in view of the image which is to be recorded.

2. The image recording device according to claim 1, wherein the intermediate image receiving member position measuring means comprises a capacitive movement sensor which measures the relative movement between the intermediate image receiving member and the printhead structure by means of which the position of the intermediate image receiving member in relation to the apertures is determined.

3. The image recording device according to claim 2, wherein the capacitive movement sensor comprises at least one first at least partially conductive area and at least one second at least partially conductive area arranged at a predetermined position in relation to the printhead structure and also at least one third at least partially conductive area on the intermediate image receiving member, whereby the at least one first at least partially conductive area, the at least one second at least partially conductive area, and the at least one third at least partially conductive area are spatially arranged in such a way that at least once in relation to the transport of pigment particles onto the intermediate image receiving member for formation of a pigment image the at least one first at least partially conductive area and the at least one third at least partially conductive area form a first capacitor, and the at least one second at least partially conductive area and the at least one third at least partially conductive area form a second capacitor in order that the capacitive movement sensor can determine a transfer function of the first capacitor and the second capacitor during a relative movement of the intermediate image receiving member and the printhead structure.

4. The image recording device according to claim 3, wherein the transfer function of the first capacitor and the second capacitor determines the relative movement between the intermediate image receiving member and the printhead structure.

5. The image recording device according to claim 3, wherein the capacitive movement sensor comprises a plurality of second at least partially conductive areas and a plurality of third at least partially conductive areas.

6. The image recording device according to claim 5, wherein the distance between adjacent second at least partially conductive areas is different from the distance between adjacent third at least partially conductive areas.

7. The image recording device according to claim 3, wherein the intermediate image receiving member comprises at least one separate image area intended for reception of pigment particles for formation of a pigment image thereon.

8. The image recording device according to claim 7, wherein the at least one second at least partially conductive area is arranged in relation to the at least one separate image area.

9. The image recording device according to claim 3, wherein the image recording device includes at least two pigment particle sources with respective corresponding, control electrodes and apertures, at least one first at least partially conductive area and at least one second at least partially conductive area arranged at a predetermined position in relation to the respective apertures, whereby the intermediate image receiving member position measuring means measures the position of the intermediate image receiving means in relation to the respective to, in cooperation with the control unit, synchronize the selective opening and closing of the respective apertures through the at least one printhead structure according to the relative movement of the at least one printhead structure and the intermediate image receiving member to thereby enable the formation of a respective pigment image at a predetermined position on the intermediate image receiving member in view of the image which is to be recorded.

10. The image recording device according to claim 9, wherein the image recording device records color images and includes four pigment particle sources.

11. The image recording device according to claim 1, wherein the image recording device includes at least two pigment particle sources with respective corresponding, control electrodes and apertures, whereby the intermediate image receiving member position measuring means measures the position of the intermediate image receiving means in relation to the respective apertures to, in cooperation with the control unit, synchronize the selective opening and closing of the respective apertures through the at least one printhead structure according to the relative movement of the at least one printhead structure and the intermediate image receiving member to thereby enable the formation of a respective pigment image at a predetermined position on the intermediate image receiving member in view of the image which is to be recorded.

12. The image recording device according to claim 11, wherein the image recording device records color images and includes four pigment particle sources.

13. The image recording device according to claim 1, wherein the intermediate image receiving member includes a transfer belt positioned at a predetermined distance from the printhead structure, the transfer belt being substantially of uniform thickness.

14. The image recording device according to claim 13, wherein the transfer belt is supported by at least one holding element arranged on the side of the second face of the transfer belt adjacent to the print station.

15. The image recording device according to claim 1, wherein the image recording device includes at least two pigment particle sources with corresponding control electrodes and apertures on and in at least one printhead structure.

16. The image recording device according to claim 1, wherein the image recording device includes four pigment particle sources with corresponding control electrodes and apertures on and in at least one printhead structure.

17. The image recording device according to claim 1, wherein the first face of the intermediate image receiving member is substantially evenly coated with a layer of bouncing reduction agent thus providing a surface on the first face of the intermediate image receiving member that the pigment particles transported through the print head structure substantially adhere to substantially without bouncing.

18. The image recording device according to claim 17, wherein the bouncing reduction agent is a liquid having adhesion properties suitable for adhesion of pigment particles to the first face of the intermediate image receiving member and wherein the image recording device further comprise a film application means for applying the bouncing reduction agent liquid substantially evenly as a film layer onto the first face of the intermediate image receiving member.

19. The image recording device according to claim 18, wherein the bouncing reduction agent is a silicone oil having appropriate adhesion properties for reducing bouncing of pigment particles when pigment particles are transferred onto the first face of the intermediate image receiving means and also having appropriate release properties when a pigment image is transferred to an information carrier from the intermediate image receiving member.

20. The image recording device according to claim 1, wherein the image recording device further comprises a transfer having heating means and pressurizing means for transferring a pigment image on the surface of the first face of the intermediate image receiving member to an information carrier by locally applying heat and pressure to the information carrier and the pigment image by the heating means and pressurizing means and thereby transferring the pigment image to the information carrier.

21. The image recording device according to claim 1, wherein the image recording device comprises a pressure changing means which can create a pressure difference on a side of the second face of the intermediate image receiving member proximate the apertures of the printhead structure, and where the intermediate image receiving member comprises a cleaning area for cleaning purposes and a separate image area intended for reception of pigment particles for formation of a pigment image thereon, where the cleaning area includes at least one slot between the first face and the second face intended for transmitting the pressure difference through the intermediate image receiving member to thereby, in cooperation with the pressure changing means proximate the apertures of the printhead structure, dislodge pigment agglomeration for cleaning the apertures of the printhead structure.

22. The image recording device according to claim 1, wherein the image recording device comprises an intermediate image receiving member bending means to enable the intermediate image receiving member to be bent a predetermined angle proximate the printhead structure in such a way that, in combination with the tension of the intermediate image receiving member, a stabilization force component is created which is equal to or greater in magnitude than a field force component created by the electrical field and acting on the intermediate image receiving member, to thereby oppose distance fluctuations between the intermediate image receiving member and the printhead structure which is caused by the field force component on the intermediate image receiving member.

23. The image recording device according to claim 1, wherein the printhead structure includes deflection electrodes connected to the control unit to thereby be able to deflect pigment particles against predetermined locations on the first face of the image receiving member in view of the image which is to be recorded.

24. The image recording device according to claim 1, wherein the printhead structure includes deflection electrodes connected to the control unit for controlling the deflection of pigment particles in transport, and where the image recording device further comprises deflection control feedback means for providing a deflection feedback signal to the control unit to thereby control the deflection electrodes in such a way that pigment particles are, for formation of a pigment image on the intermediate image receiving member in view of the image which is to be recorded, trajected toward predetermined locations on the intermediate image receiving member.

* * * * *

UNITED STATES PATENT AND TRADEMARK OFFICE
CERTIFICATE OF CORRECTION

PATENT NO. : 6,030,070
DATED : February 29, 2000
INVENTOR(S) : Bengt Bern, et al.

It is certified that error appears in the above-identified patent and that said Letters Patent is hereby corrected as shown below:

In column 26 at line 28, change "transfer" to --transfuser--.

Signed and Sealed this

Fifteenth Day of May, 2001

Attest:

NICHOLAS P. GODICI

Attesting Officer        Acting Director of the United States Patent and Trademark Office